United States Patent
Ganguli et al.

(10) Patent No.: US 11,228,539 B2
(45) Date of Patent: Jan. 18, 2022

(54) TECHNOLOGIES FOR MANAGING DISAGGREGATED ACCELERATOR NETWORKS BASED ON REMOTE DIRECT MEMORY ACCESS

(71) Applicant: Intel Corporation, Santa Clara, CA (US)

(72) Inventors: Mrittika Ganguli, Tempe, AZ (US); Sugesh Chandran, Mallow (IE); Parthasarathy Sarangam, Portland, OR (US); Sujoy Sen, Beaverton, OR (US); Susanne M. Balle, Hudson, NH (US); Rajesh Sankaran, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 16/540,807

(22) Filed: Aug. 14, 2019

(65) Prior Publication Data

US 2019/0372914 A1    Dec. 5, 2019

(51) Int. Cl.
*H04L 12/931* (2013.01)
*H04L 29/12* (2006.01)
*H04L 12/06* (2006.01)
*G06F 30/34* (2020.01)

(52) U.S. Cl.
CPC .......... *H04L 49/70* (2013.01); *G06F 30/34* (2020.01); *H04L 12/06* (2013.01); *H04L 61/2007* (2013.01)

(58) Field of Classification Search
None
See application file for complete search history.

(56) References Cited

U.S. PATENT DOCUMENTS

| | | | |
|---|---|---|---|
| 6,779,051 B1 * | 8/2004 | Basil | H04L 12/4633 370/401 |
| 9,859,918 B1 * | 1/2018 | Gopal | H05K 7/1442 |
| 9,983,860 B1 * | 5/2018 | Koty | H04L 67/10 |
| 10,083,026 B1 * | 9/2018 | Venkata | G06F 8/656 |

(Continued)

OTHER PUBLICATIONS

Sagie, Gal, http://galsagie.github.io/2015/04/26/ovn-containers/, "Containers Support in OVN," Apr. 26, 2015, 4 pages.

*Primary Examiner* — Nicholas Sloms
(74) *Attorney, Agent, or Firm* — Compass IP Law, PC

(57) ABSTRACT

Technologies for network interface controllers (NICs) include a compute sled and an accelerator sled in communication over a network. The accelerator sled configures a virtual switch endpoint associated with a remote direct memory access (RDMA) server instance that is associated with a field-programmable gate array (FPGA) of the accelerator sled. The accelerator sled updates local software defined networking (SDN) tables with a virtual tunnel associated with the virtual switch endpoint and a remote compute sled. A virtual switch of the accelerator sled switches virtual tunnel traffic from the remote compute sled to the RDMA server instance, which transfers data to or from the FPGA. The compute sled also updates a local SDN table with the virtual tunnel, and a virtual switch of the compute sled switches virtual tunnel traffic to or from the accelerator sled. Other embodiments are described and claimed.

25 Claims, 21 Drawing Sheets

(56) References Cited

U.S. PATENT DOCUMENTS

| | | | |
|---|---|---|---|
| 2004/0010612 A1* | 1/2004 | Pandya | H04L 67/1097 709/230 |
| 2014/0040459 A1* | 2/2014 | Agrawal | H04L 45/14 709/224 |
| 2014/0201374 A1* | 7/2014 | Ashwood-Smith | G06F 9/50 709/226 |
| 2014/0237156 A1* | 8/2014 | Regula | G06F 13/4027 710/314 |
| 2014/0286336 A1* | 9/2014 | Narayanan | H04L 49/25 370/392 |
| 2015/0381418 A1* | 12/2015 | Fausak | H04L 41/046 709/221 |
| 2016/0054922 A1* | 2/2016 | Awasthi | G06F 3/0631 711/103 |
| 2016/0124742 A1* | 5/2016 | Rangasamy | H04L 41/0803 717/103 |
| 2016/0188527 A1* | 6/2016 | Cherian | H04L 69/22 709/212 |
| 2016/0337175 A1* | 11/2016 | Rao | H04L 41/12 |
| 2016/0352538 A1* | 12/2016 | Chiu | H04L 12/4633 |
| 2017/0177396 A1* | 6/2017 | Palermo | H04L 49/70 |
| 2017/0212776 A1* | 7/2017 | Palermo | G06F 9/45558 |
| 2017/0289256 A1* | 10/2017 | Kumar | H04L 41/12 |
| 2018/0019948 A1* | 1/2018 | Patwardhan | H04L 47/2475 |
| 2018/0024739 A1* | 1/2018 | Schmisseur | G02B 6/3897 711/105 |
| 2018/0024771 A1* | 1/2018 | Miller | G06F 3/0625 711/154 |
| 2018/0027093 A1* | 1/2018 | Guim Bernat | H04L 41/5025 709/221 |
| 2018/0027680 A1* | 1/2018 | Kumar | G02B 6/3882 361/807 |
| 2018/0027687 A1* | 1/2018 | Adiletta | G02B 6/3893 361/679.32 |
| 2018/0109471 A1* | 4/2018 | Chang | H04L 49/253 |
| 2018/0150240 A1* | 5/2018 | Bernat | H03M 7/40 |
| 2018/0150298 A1* | 5/2018 | Balle | H03M 7/60 |
| 2018/0150391 A1* | 5/2018 | Mitchel | H05K 7/1487 |
| 2018/0152540 A1* | 5/2018 | Niell | G06F 9/4881 |
| 2018/0219797 A1* | 8/2018 | Sen | H04L 67/34 |
| 2019/0303345 A1* | 10/2019 | Zhu | G06F 13/28 |

* cited by examiner

TECHNOLOGIES FOR MANAGING DISAGGREGATED ACCELERATOR NETWORKS BASED ON REMOTE DIRECT MEMORY ACCESS

BACKGROUND

Data centers and other distributed computing systems may include disaggregated components, such as pooled accelerator devices. Such systems may communicate network traffic to a mailbox representing the accelerator devices, and software may transfer the traffic to the appropriate accelerator client queue. In those systems, flow management up to the end point (e.g., accelerator device) may not be possible, and end point services may not be exposed to an orchestration layer.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
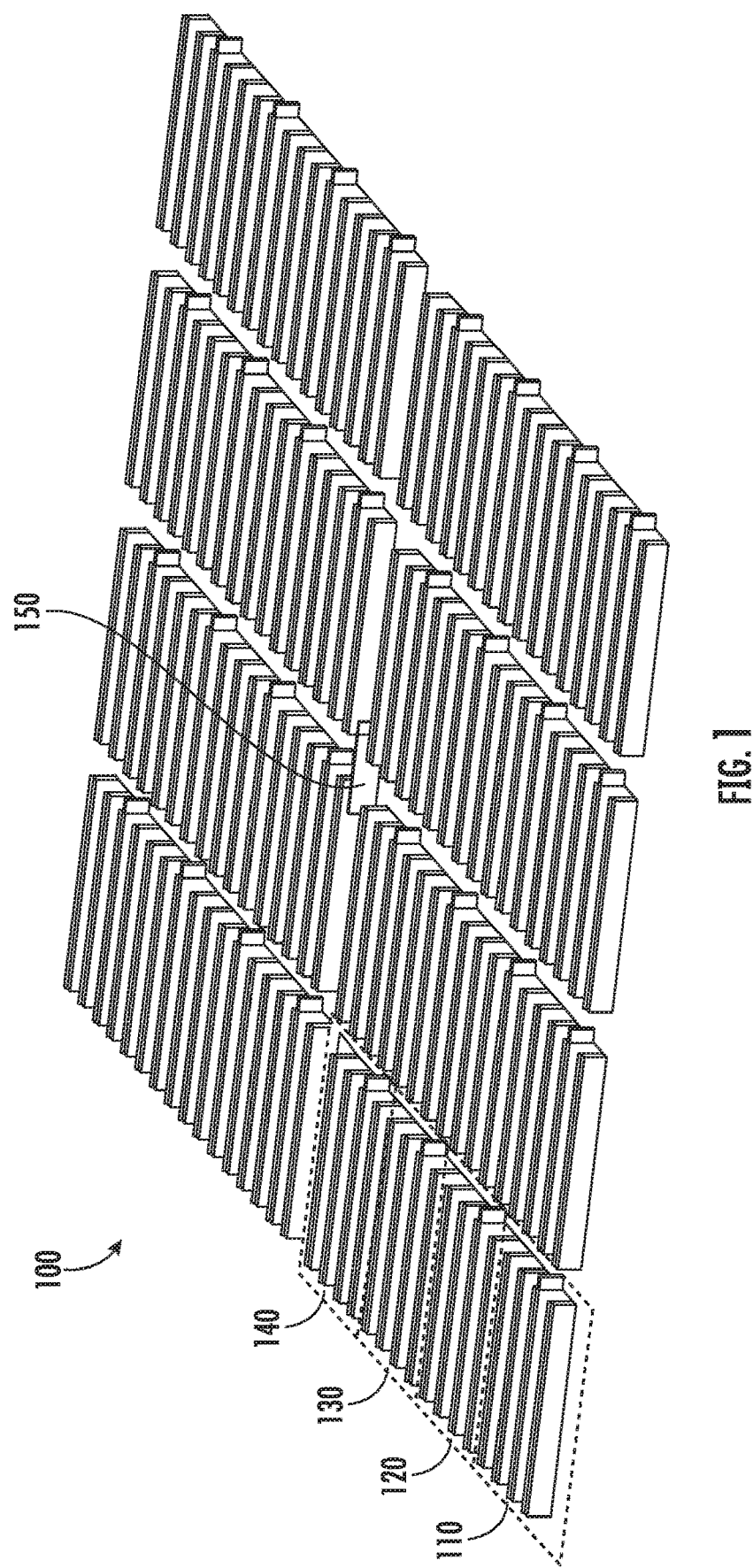
FIG. 1 is a simplified diagram of at least one embodiment of a data center for executing workloads with disaggregated resources.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a data center 100 in which disaggregated resources may cooperatively execute one or more workloads (e.g., applications on behalf of customers) includes multiple pods 110, 120, 130, 140, each of which includes one or more rows of racks. Of course, although data center 100 is shown with multiple pods, in some embodiments, the data center 100 may be embodied as a single pod. As described in more detail herein, each rack houses multiple sleds, each of which may be primarily equipped with a particular type of resource (e.g., memory devices, data storage devices, accelerator devices, general purpose processors), i.e., resources that can be logically coupled to form a composed node, which can act as, for example, a server. In the illustrative embodiment, the sleds in each pod 110, 120, 130, 140 are connected to multiple pod switches (e.g., switches that route data communications to and from sleds within the pod). The pod switches, in turn, connect with spine switches 150 that switch communications among pods (e.g., the pods 110, 120, 130, 140) in the data center 100. In some embodiments, the sleds may be connected with a fabric using Intel Omni-Path technology. In other embodiments, the sleds may be connected with other fabrics, such as InfiniBand or Ethernet. As described in more detail herein, resources within sleds in the data center 100 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 110, 120, 130, 140. As such, some resources of a single sled may be allocated to one managed node while other resources of the same sled are allocated to a different managed node (e.g., one processor assigned to one managed node and another processor of the same sled assigned to a different managed node).

A data center comprising disaggregated resources, such as data center 100, can be used in a wide variety of contexts, such as enterprise, government, cloud service provider, and communications service provider (e.g., Telco's), as well in a wide variety of sizes, from cloud service provider mega-data centers that consume over 100,000 sq. ft. to single- or multi-rack installations for use in base stations.

The disaggregation of resources to sleds comprised predominantly of a single type of resource (e.g., compute sleds comprising primarily compute resources, memory sleds containing primarily memory resources), and the selective allocation and deallocation of the disaggregated resources to form a managed node assigned to execute a workload improves the operation and resource usage of the data center 100 relative to typical data centers comprised of hyperconverged servers containing compute, memory, storage and perhaps additional resources in a single chassis. For example, because sleds predominantly contain resources of a particular type, resources of a given type can be upgraded independently of other resources. Additionally, because different resources types (processors, storage, accelerators, etc.) typically have different refresh rates, greater resource utilization and reduced total cost of ownership may be achieved. For example, a data center operator can upgrade the processors throughout their facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 2:
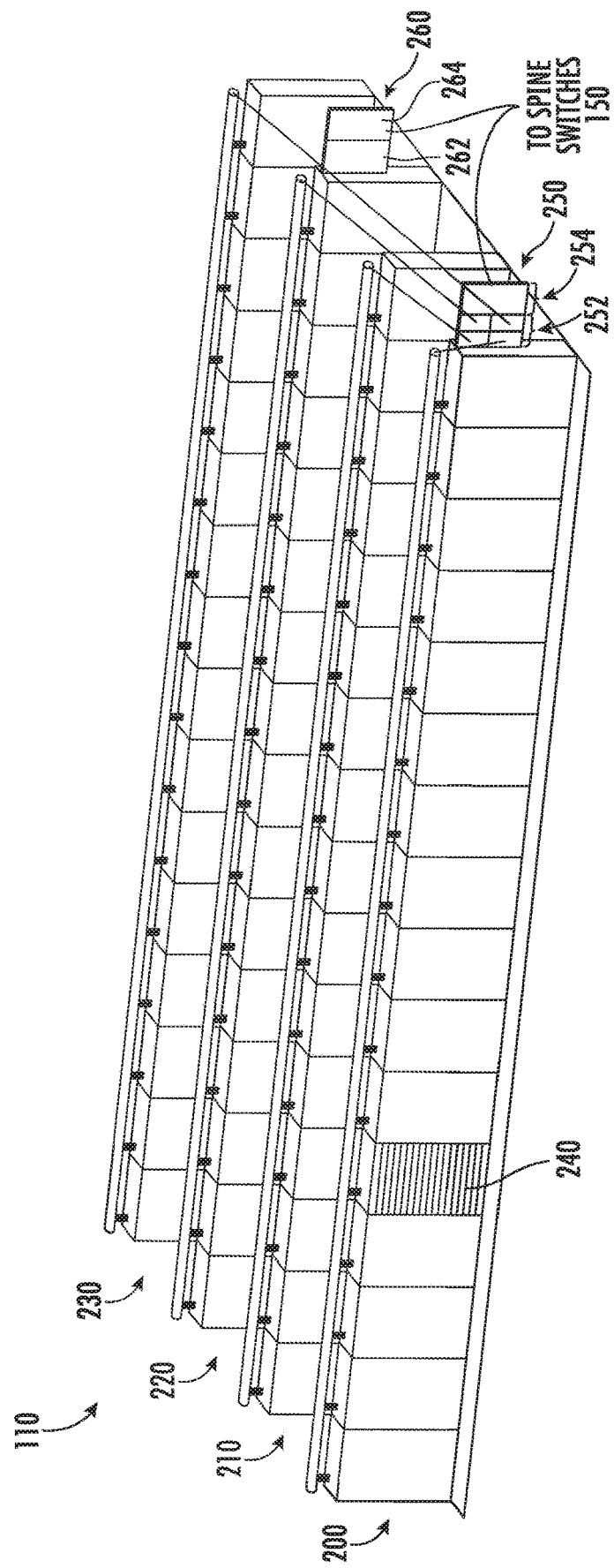
FIG. 2 is a simplified diagram of at least one embodiment of a pod that may be included in the data center of FIG. 1.

Referring now to FIG. 2, the pod 110, in the illustrative embodiment, includes a set of rows 200, 210, 220, 230 of racks 240. Each rack 240 may house multiple sleds (e.g., sixteen sleds) and provide power and data connections to the housed sleds, as described in more detail herein. In the illustrative embodiment, the racks in each row 200, 210, 220, 230 are connected to multiple pod switches 250, 260. The pod switch 250 includes a set of ports 252 to which the sleds of the racks of the pod 110 are connected and another set of ports 254 that connect the pod 110 to the spine switches 150 to provide connectivity to other pods in the data center 100. Similarly, the pod switch 260 includes a set of ports 262 to which the sleds of the racks of the pod 110 are connected and a set of ports 264 that connect the pod 110 to the spine switches 150. As such, the use of the pair of switches 250, 260 provides an amount of redundancy to the pod 110. For example, if either of the switches 250, 260 fails, the sleds in the pod 110 may still maintain data communication with the remainder of the data center 100 (e.g., sleds of other pods) through the other switch 250, 260. Furthermore, in the illustrative embodiment, the switches 150, 250, 260 may be embodied as dual-mode optical switches, capable of routing both Ethernet protocol communications carrying Internet Protocol (IP) packets and communications according to a second, high-performance link-layer protocol (e.g., Intel's Omni-Path Architecture's, InfiniBand, PCI Express) via optical signaling media of an optical fabric.

It should be appreciated that each of the other pods 120, 130, 140 (as well as any additional pods of the data center 100) may be similarly structured as, and have components similar to, the pod 110 shown in and described in regard to FIG. 2 (e.g., each pod may have rows of racks housing multiple sleds as described above). Additionally, while two pod switches 250, 260 are shown, it should be understood that in other embodiments, each pod 110, 120, 130, 140 may be connected to a different number of pod switches, providing even more failover capacity. Of course, in other embodiments, pods may be arranged differently than the rows-of-racks configuration shown in FIGS. 1-2. For example, a pod may be embodied as multiple sets of racks in which each set of racks is arranged radially, i.e., the racks are equidistant from a center switch.

Figure 3:
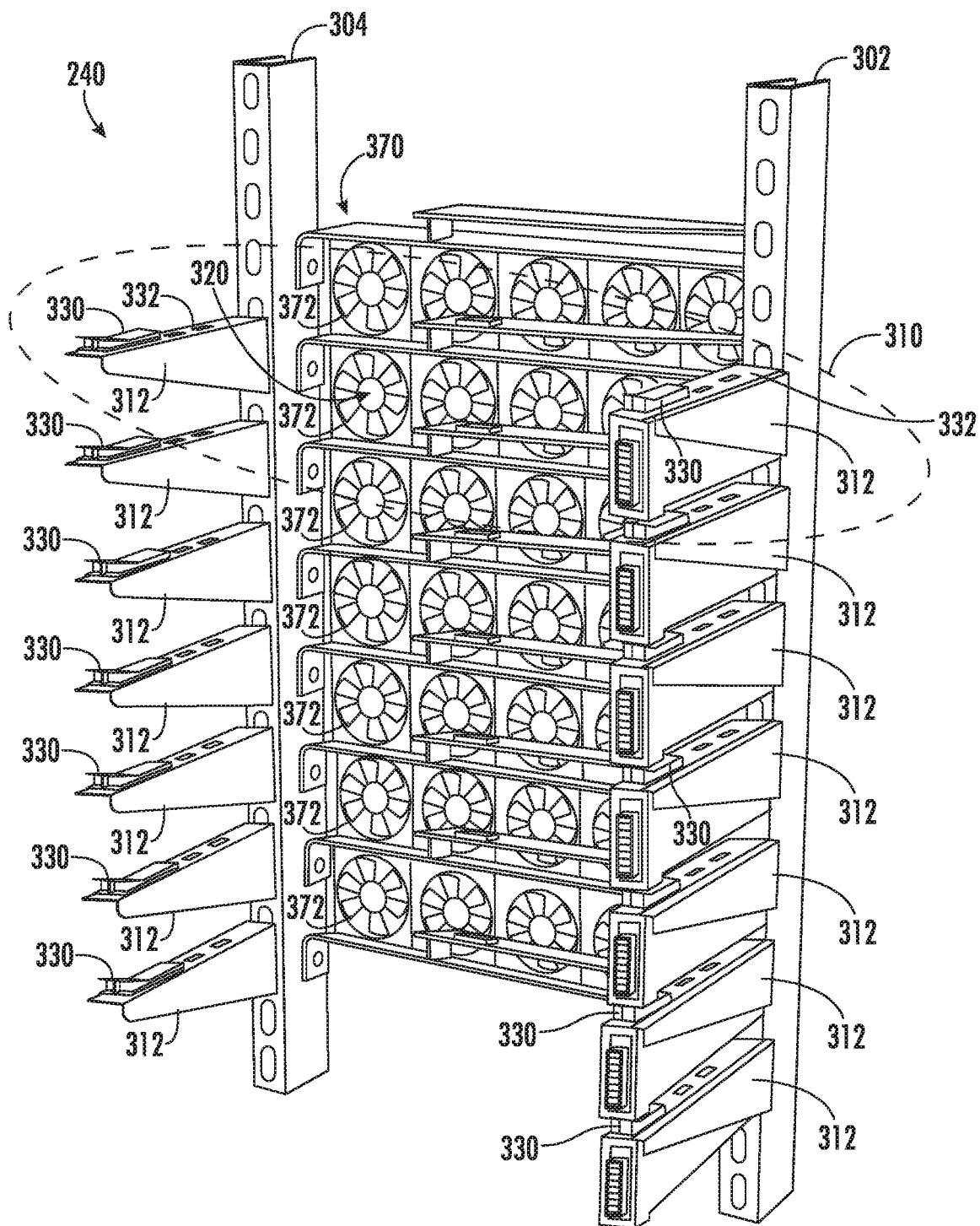
FIG. 3 is a perspective view of at least one embodiment of a rack that may be included in the pod of FIG. 2.
Figure 4:
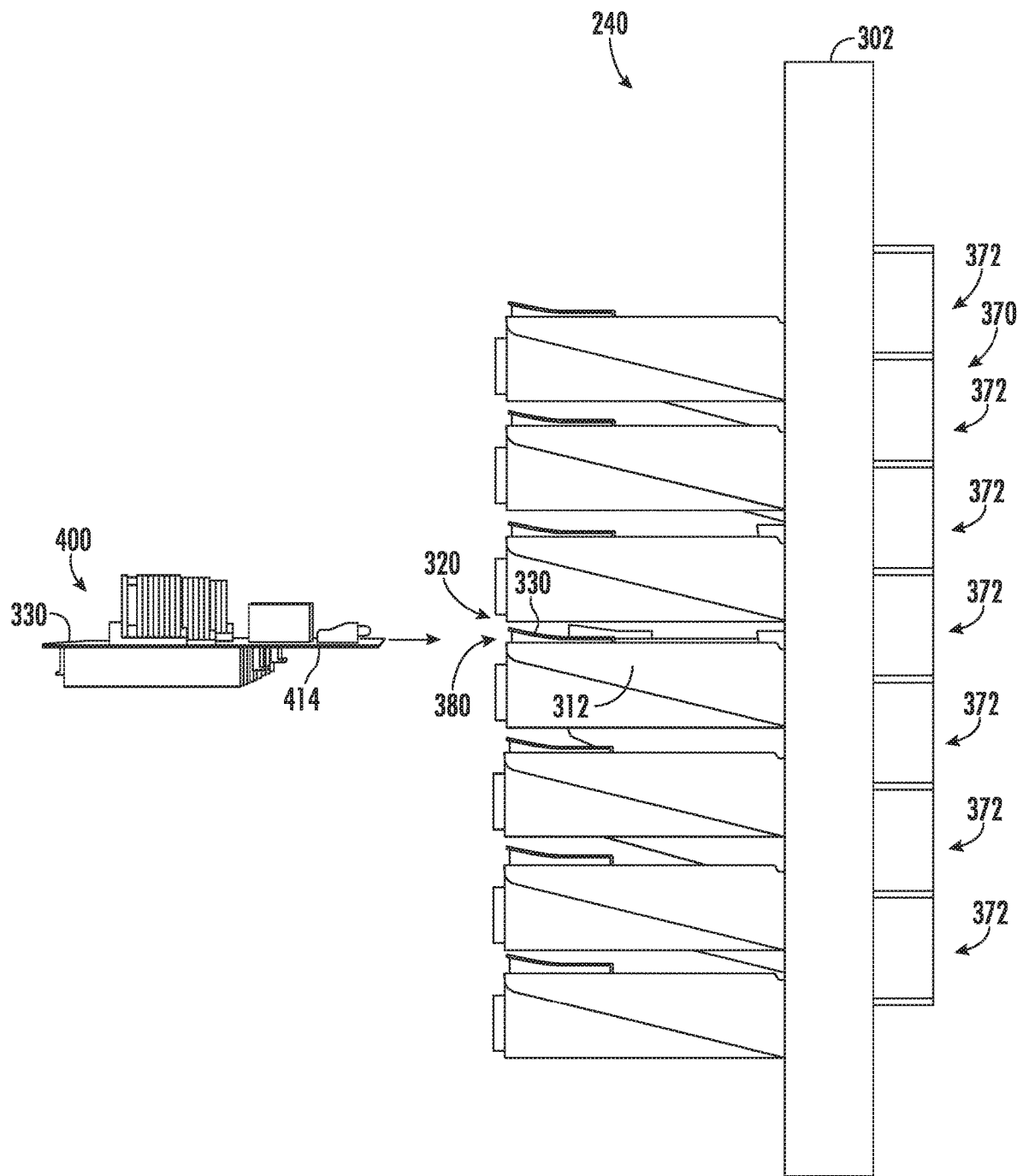
FIG. 4 is a side elevation view of the rack of FIG. 3.
Figure 5:
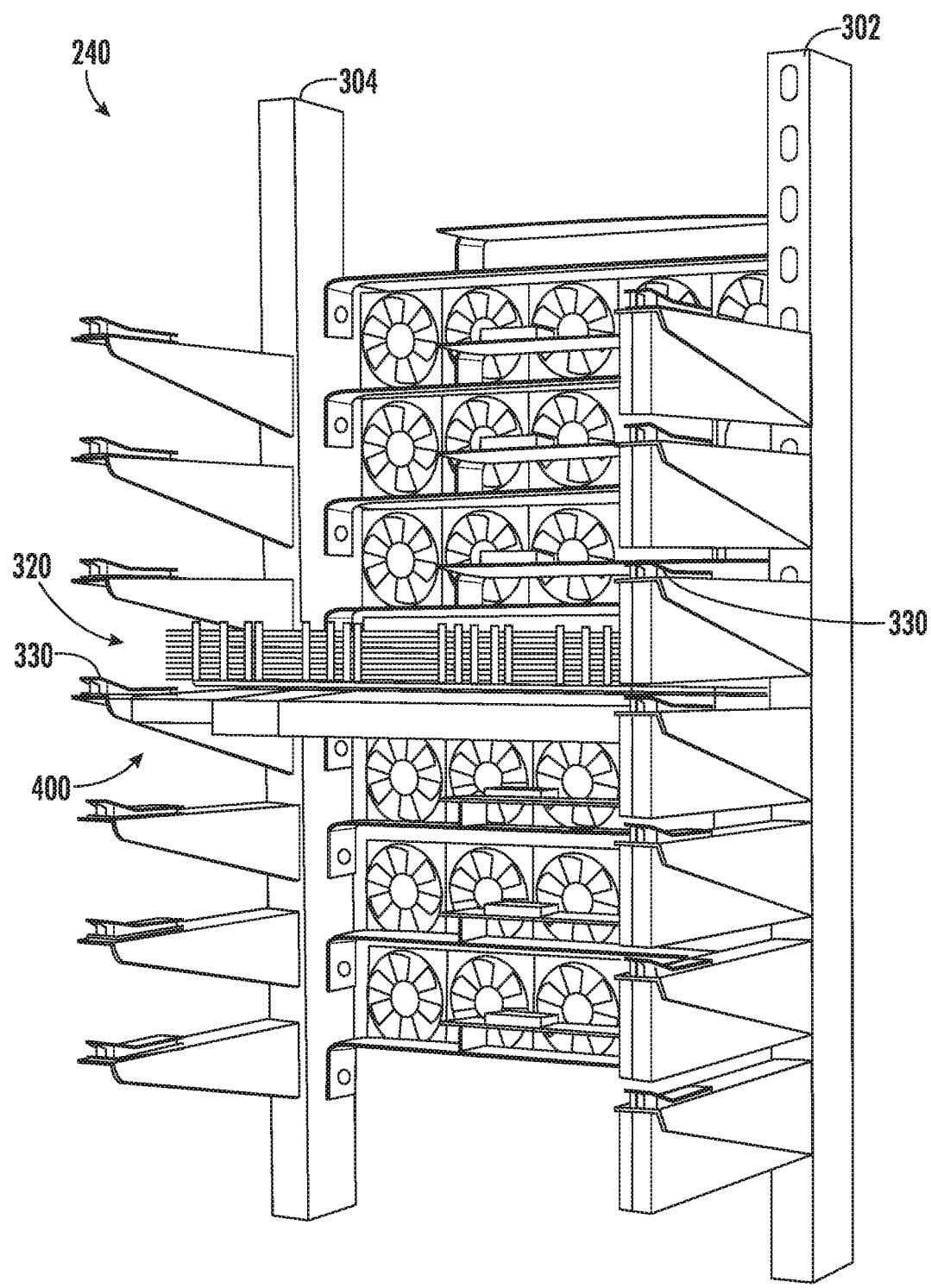
FIG. 5 is a perspective view of the rack of FIG. 3 having a sled mounted therein.

Referring now to FIGS. 3-5, each illustrative rack 240 of the data center 100 includes two elongated support posts 302, 304, which are arranged vertically. For example, the elongated support posts 302, 304 may extend upwardly from a floor of the data center 100 when deployed. The rack 240 also includes one or more horizontal pairs 310 of elongated support arms 312 (identified in FIG. 3 via a dashed ellipse) configured to support a sled of the data center 100 as discussed below. One elongated support arm 312 of the pair of elongated support arms 312 extends outwardly from the elongated support post 302 and the other elongated support arm 312 extends outwardly from the elongated support post 304.

In the illustrative embodiments, each sled of the data center 100 is embodied as a chassis-less sled. That is, each sled has a chassis-less circuit board substrate on which physical resources (e.g., processors, memory, accelerators, storage, etc.) are mounted as discussed in more detail below. As such, the rack 240 is configured to receive the chassis-less sleds. For example, each pair 310 of elongated support arms 312 defines a sled slot 320 of the rack 240, which is configured to receive a corresponding chassis-less sled. To do so, each illustrative elongated support arm 312 includes a circuit board guide 330 configured to receive the chassis-less circuit board substrate of the sled. Each circuit board guide 330 is secured to, or otherwise mounted to, a top side 332 of the corresponding elongated support arm 312. For example, in the illustrative embodiment, each circuit board guide 330 is mounted at a distal end of the corresponding elongated support arm 312 relative to the corresponding elongated support post 302, 304. For clarity of the Figures, not every circuit board guide 330 may be referenced in each Figure.

Each circuit board guide 330 includes an inner wall that defines a circuit board slot 380 configured to receive the chassis-less circuit board substrate of a sled 400 when the sled 400 is received in the corresponding sled slot 320 of the rack 240. To do so, as shown in FIG. 4, a user (or robot) aligns the chassis-less circuit board substrate of an illustrative chassis-less sled 400 to a sled slot 320. The user, or robot, may then slide the chassis-less circuit board substrate forward into the sled slot 320 such that each side edge 414 of the chassis-less circuit board substrate is received in a corresponding circuit board slot 380 of the circuit board guides 330 of the pair 310 of elongated support arms 312 that define the corresponding sled slot 320 as shown in FIG. 4. By having robotically accessible and robotically manipulable sleds comprising disaggregated resources, each type of resource can be upgraded independently of each other and at their own optimized refresh rate. Furthermore, the sleds are configured to blindly mate with power and data communication cables in each rack 240, enhancing their ability to be quickly removed, upgraded, reinstalled, and/or replaced. As such, in some embodiments, the data center 100 may operate (e.g., execute workloads, undergo maintenance and/or upgrades, etc.) without human involvement on the data center floor. In other embodiments, a human may facilitate one or more maintenance or upgrade operations in the data center 100.

It should be appreciated that each circuit board guide 330 is dual sided. That is, each circuit board guide 330 includes an inner wall that defines a circuit board slot 380 on each side of the circuit board guide 330. In this way, each circuit board guide 330 can support a chassis-less circuit board substrate on either side. As such, a single additional elongated support post may be added to the rack 240 to turn the rack 240 into a two-rack solution that can hold twice as many sled slots 320 as shown in FIG. 3. The illustrative rack 240 includes seven pairs 310 of elongated support arms 312 that define a corresponding seven sled slots 320, each configured to receive and support a corresponding sled 400 as discussed above. Of course, in other embodiments, the rack 240 may include additional or fewer pairs 310 of elongated support arms 312 (i.e., additional or fewer sled slots 320). It should be appreciated that because the sled 400 is chassis-less, the sled 400 may have an overall height that is different than typical servers. As such, in some embodiments, the height of each sled slot 320 may be shorter than the height of a typical server (e.g., shorter than a single rank unit, "1U"). That is, the vertical distance between each pair 310 of elongated support arms 312 may be less than a standard rack unit "1U." Additionally, due to the relative decrease in height of the sled slots 320, the overall height of the rack 240 in some embodiments may be shorter than the height of traditional rack enclosures. For example, in some embodiments, each of the elongated support posts 302, 304 may have a length of six feet or less. Again, in other embodiments, the rack 240 may have different dimensions. For example, in some embodiments, the vertical distance between each pair 310 of elongated support arms 312 may be greater than a standard rack until "1U". In such embodiments, the increased vertical distance between the sleds allows for larger heat sinks to be attached to the physical resources and for larger fans to be used (e.g., in the fan array 370 described below) for cooling each sled, which in turn can allow the physical resources to operate at increased power levels. Further, it should be appreciated that the rack 240 does not include any walls, enclosures, or the like. Rather, the rack 240 is an enclosure-less rack that is opened to the local environment. Of course, in some cases, an end plate may be attached to one of the elongated support posts 302, 304 in those situations in which the rack 240 forms an end-of-row rack in the data center 100.

In some embodiments, various interconnects may be routed upwardly or downwardly through the elongated support posts 302, 304. To facilitate such routing, each elongated support post 302, 304 includes an inner wall that defines an inner chamber in which interconnects may be located. The interconnects routed through the elongated support posts 302, 304 may be embodied as any type of interconnects including, but not limited to, data or communication interconnects to provide communication connections to each sled slot 320, power interconnects to provide power to each sled slot 320, and/or other types of interconnects.

The rack 240, in the illustrative embodiment, includes a support platform on which a corresponding optical data connector (not shown) is mounted. Each optical data connector is associated with a corresponding sled slot 320 and is configured to mate with an optical data connector of a corresponding sled 400 when the sled 400 is received in the corresponding sled slot 320. In some embodiments, optical connections between components (e.g., sleds, racks, and switches) in the data center 100 are made with a blind mate optical connection. For example, a door on each cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 240 also includes a fan array 370 coupled to the cross-support arms of the rack 240. The fan array 370 includes one or more rows of cooling fans 372, which are aligned in a horizontal line between the elongated support posts 302, 304. In the illustrative embodiment, the fan array 370 includes a row of cooling fans 372 for each sled slot 320 of the rack 240. As discussed above, each sled 400 does not include any on-board cooling system in the illustrative embodiment and, as such, the fan array 370 provides cooling for each sled 400 received in the rack 240. Each rack 240, in the illustrative embodiment, also includes a power supply associated with each sled slot 320. Each power supply is secured to one of the elongated support arms 312 of the pair 310 of elongated support arms 312 that define the corresponding sled slot 320. For example, the rack 240 may include a power supply coupled or secured to each elongated support arm 312 extending from the elongated support post 302. Each power supply includes a power connector configured to mate with a power connector of the sled 400 when the sled 400 is received in the corresponding sled slot 320. In the illustrative embodiment, the sled 400 does not include any on-board power supply and, as such, the power supplies provided in the rack 240 supply power to corresponding sleds 400 when mounted to the rack 240. Each power supply is configured to satisfy the power requirements for its associated sled, which can vary from sled to sled. Additionally, the power supplies provided in the rack 240 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 6:
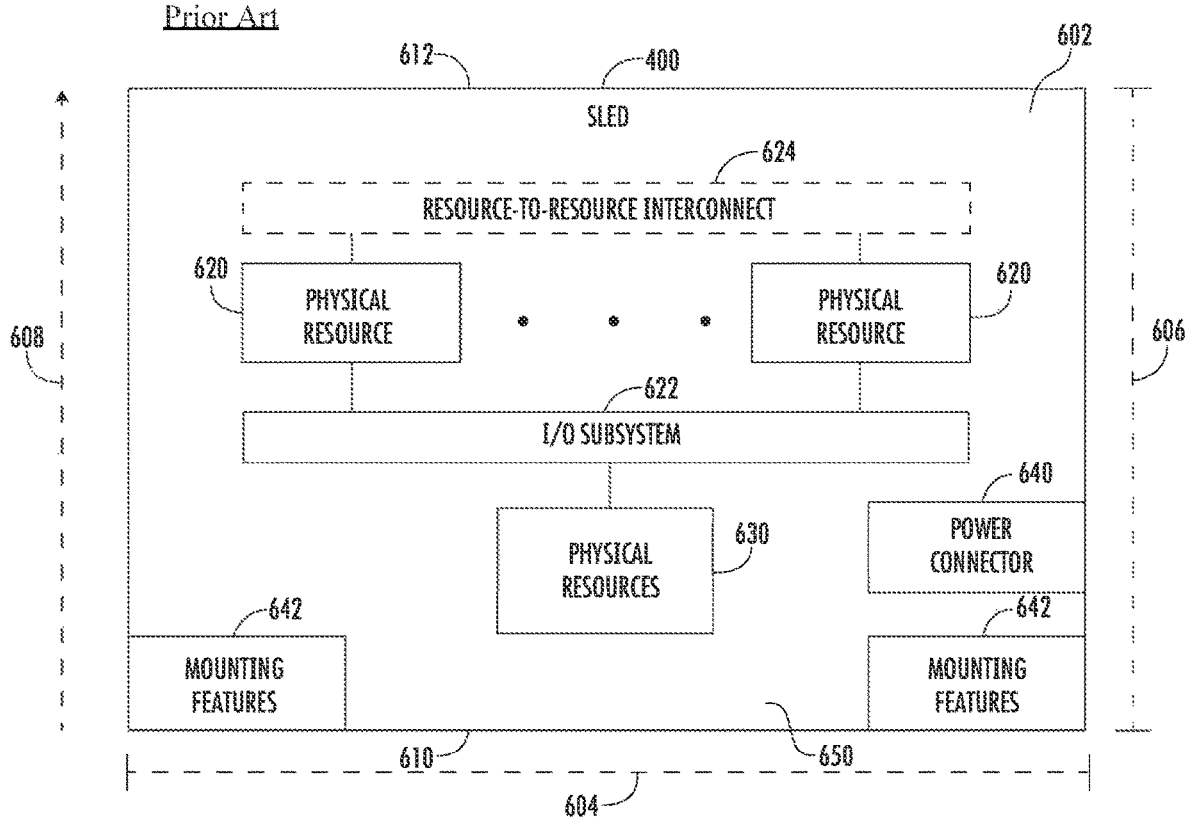
FIG. 6 is a is a simplified block diagram of at least one embodiment of a top side of the sled of FIG. 5.

Referring now to FIG. 6, the sled 400, in the illustrative embodiment, is configured to be mounted in a corresponding rack 240 of the data center 100 as discussed above. In some embodiments, each sled 400 may be optimized or otherwise configured for performing particular tasks, such as compute tasks, acceleration tasks, data storage tasks, etc. For example, the sled 400 may be embodied as a compute sled 800 as discussed below in regard to FIGS. 8-9, an accelerator sled 1000 as discussed below in regard to FIGS. 10-11, a storage sled 1200 as discussed below in regard to FIGS. 12-13, or as a sled optimized or otherwise configured to perform other specialized tasks, such as a memory sled 1400, discussed below in regard to FIG. 14.

As discussed above, the illustrative sled 400 includes a chassis-less circuit board substrate 602, which supports various physical resources (e.g., electrical components) mounted thereon. It should be appreciated that the circuit board substrate 602 is "chassis-less" in that the sled 400 does not include a housing or enclosure. Rather, the chassis-less circuit board substrate 602 is open to the local environment. The chassis-less circuit board substrate 602 may be formed from any material capable of supporting the various electrical components mounted thereon. For example, in an illustrative embodiment, the chassis-less circuit board substrate 602 is formed from an FR-4 glass-reinforced epoxy laminate material. Of course, other materials may be used to form the chassis-less circuit board substrate 602 in other embodiments.

As discussed in more detail below, the chassis-less circuit board substrate 602 includes multiple features that improve the thermal cooling characteristics of the various electrical components mounted on the chassis-less circuit board substrate 602. As discussed, the chassis-less circuit board substrate 602 does not include a housing or enclosure, which may improve the airflow over the electrical components of the sled 400 by reducing those structures that may inhibit air flow. For example, because the chassis-less circuit board substrate 602 is not positioned in an individual housing or enclosure, there is no vertically-arranged backplane (e.g., a backplate of the chassis) attached to the chassis-less circuit board substrate 602, which could inhibit air flow across the electrical components. Additionally, the chassis-less circuit board substrate 602 has a geometric shape configured to reduce the length of the airflow path across the electrical components mounted to the chassis-less circuit board substrate 602. For example, the illustrative chassis-less circuit board substrate 602 has a width 604 that is greater than a depth 606 of the chassis-less circuit board substrate 602. In one particular embodiment, for example, the chassis-less circuit board substrate 602 has a width of about 21 inches and a depth of about 9 inches, compared to a typical server that has a width of about 17 inches and a depth of about 39 inches. As such, an airflow path 608 that extends from a front edge 610 of the chassis-less circuit board substrate 602 toward a rear edge 612 has a shorter distance relative to typical servers, which may improve the thermal cooling characteristics of the sled 400. Furthermore, although not illustrated in FIG. 6, the various physical resources mounted to the chassis-less circuit board substrate 602 are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 602 linearly in-line with each other along the direction of the airflow path 608 (i.e., along a direction extending from the front edge 610 toward the rear edge 612 of the chassis-less circuit board substrate 602).

As discussed above, the illustrative sled 400 includes one or more physical resources 620 mounted to a top side 650 of the chassis-less circuit board substrate 602. Although two physical resources 620 are shown in FIG. 6, it should be appreciated that the sled 400 may include one, two, or more physical resources 620 in other embodiments. The physical resources 620 may be embodied as any type of processor, controller, or other compute circuit capable of performing various tasks such as compute functions and/or controlling the functions of the sled 400 depending on, for example, the type or intended functionality of the sled 400. For example, as discussed in more detail below, the physical resources 620 may be embodied as high-performance processors in embodiments in which the sled 400 is embodied as a compute sled, as accelerator co-processors or circuits in embodiments in which the sled 400 is embodied as an accelerator sled, storage controllers in embodiments in which the sled 400 is embodied as a storage sled, or a set of memory devices in embodiments in which the sled 400 is embodied as a memory sled.

The sled 400 also includes one or more additional physical resources 630 mounted to the top side 650 of the chassis-less circuit board substrate 602. In the illustrative embodiment, the additional physical resources include a network interface controller (NIC) as discussed in more detail below. Of course, depending on the type and functionality of the sled 400, the physical resources 630 may include additional or other electrical components, circuits, and/or devices in other embodiments.

The physical resources 620 are communicatively coupled to the physical resources 630 via an input/output (I/O) subsystem 622. The I/O subsystem 622 may be embodied as circuitry and/or components to facilitate input/output operations with the physical resources 620, the physical resources 630, and/or other components of the sled 400. For example, the I/O subsystem 622 may be embodied as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative embodiment, the I/O subsystem 622 is embodied as, or otherwise includes, a double data rate 4 (DDR4) data bus or a DDR5 data bus.

In some embodiments, the sled 400 may also include a resource-to-resource interconnect 624. The resource-to-resource interconnect 624 may be embodied as any type of communication interconnect capable of facilitating resource-to-resource communications. In the illustrative embodiment, the resource-to-resource interconnect 624 is embodied as a high-speed point-to-point interconnect (e.g., faster than the I/O subsystem 622). For example, the resource-to-resource interconnect 624 may be embodied as a QuickPath Interconnect (QPI), an UltraPath Interconnect (UPI), or other high-speed point-to-point interconnect dedicated to resource-to-resource communications.

The sled 400 also includes a power connector 640 configured to mate with a corresponding power connector of the rack 240 when the sled 400 is mounted in the corresponding rack 240. The sled 400 receives power from a power supply of the rack 240 via the power connector 640 to supply power to the various electrical components of the sled 400. That is, the sled 400 does not include any local power supply (i.e., an on-board power supply) to provide power to the electrical components of the sled 400. The exclusion of a local or on-board power supply facilitates the reduction in the overall footprint of the chassis-less circuit board substrate 602, which may increase the thermal cooling characteristics of the various electrical components mounted on the chassis-less circuit board substrate 602 as discussed above. In some embodiments, voltage regulators are placed on a bottom side 750 (see FIG. 7) of the chassis-less circuit board substrate 602 directly opposite of the processors 820 (see FIG. 8), and power is routed from the voltage regulators to the processors 820 by vias extending through the circuit board substrate 602. Such a configuration provides an increased thermal budget, additional current and/or voltage, and better voltage control relative to typical printed circuit boards in which processor power is delivered from a voltage regulator, in part, by printed circuit traces.

In some embodiments, the sled 400 may also include mounting features 642 configured to mate with a mounting arm, or other structure, of a robot to facilitate the placement of the sled 600 in a rack 240 by the robot. The mounting features 642 may be embodied as any type of physical structures that allow the robot to grasp the sled 400 without damaging the chassis-less circuit board substrate 602 or the electrical components mounted thereto. For example, in some embodiments, the mounting features 642 may be embodied as non-conductive pads attached to the chassis-less circuit board substrate 602. In other embodiments, the mounting features may be embodied as brackets, braces, or other similar structures attached to the chassis-less circuit board substrate 602. The particular number, shape, size, and/or make-up of the mounting feature 642 may depend on the design of the robot configured to manage the sled 400.

Figure 7:
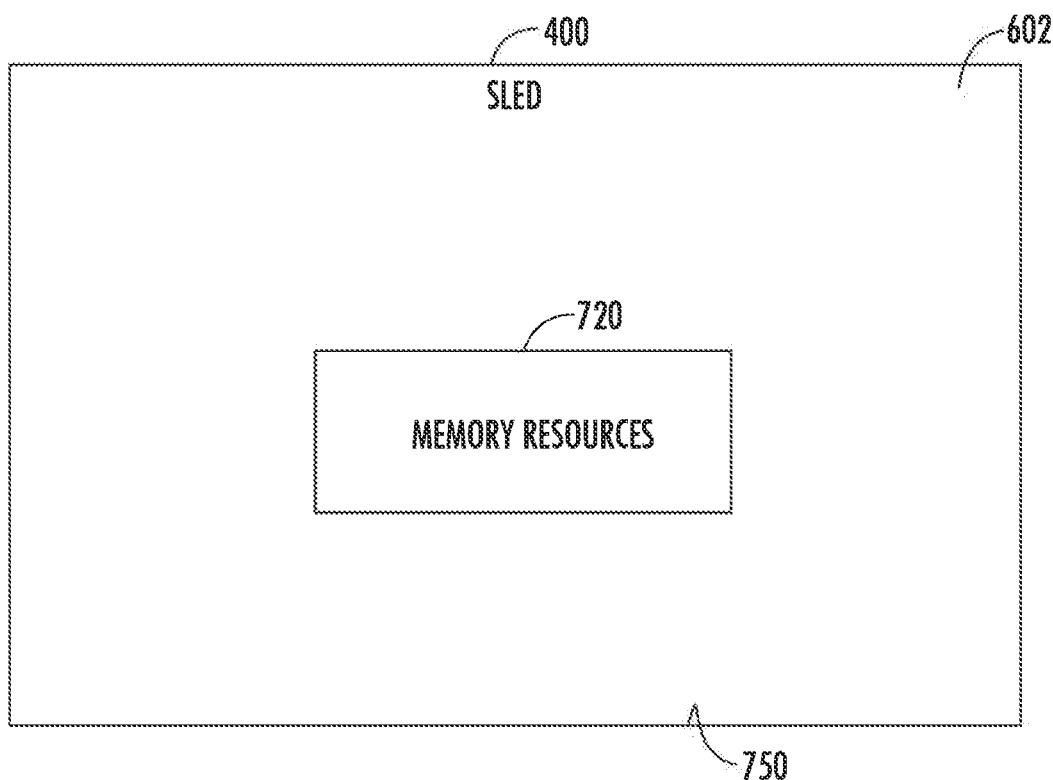
FIG. 7 is a simplified block diagram of at least one embodiment of a bottom side of the sled of FIG. 6.

Referring now to FIG. 7, in addition to the physical resources 630 mounted on the top side 650 of the chassis-less circuit board substrate 602, the sled 400 also includes one or more memory devices 720 mounted to a bottom side 750 of the chassis-less circuit board substrate 602. That is, the chassis-less circuit board substrate 602 is embodied as a double-sided circuit board. The physical resources 620 are communicatively coupled to the memory devices 720 via the I/O subsystem 622. For example, the physical resources 620 and the memory devices 720 may be communicatively coupled by one or more vias extending through the chassis-less circuit board substrate 602. Each physical resource 620 may be communicatively coupled to a different set of one or more memory devices 720 in some embodiments. Alternatively, in other embodiments, each physical resource 620 may be communicatively coupled to each memory device 720.

The memory devices 720 may be embodied as any type of memory device capable of storing data for the physical resources 620 during operation of the sled 400, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one embodiment, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some embodiments, the memory device may comprise a transistor-less stackable cross point architecture in which memory cells sit at the intersection of word lines and bit lines and are individually addressable and in which bit storage is based on a change in bulk resistance.

Figure 8:
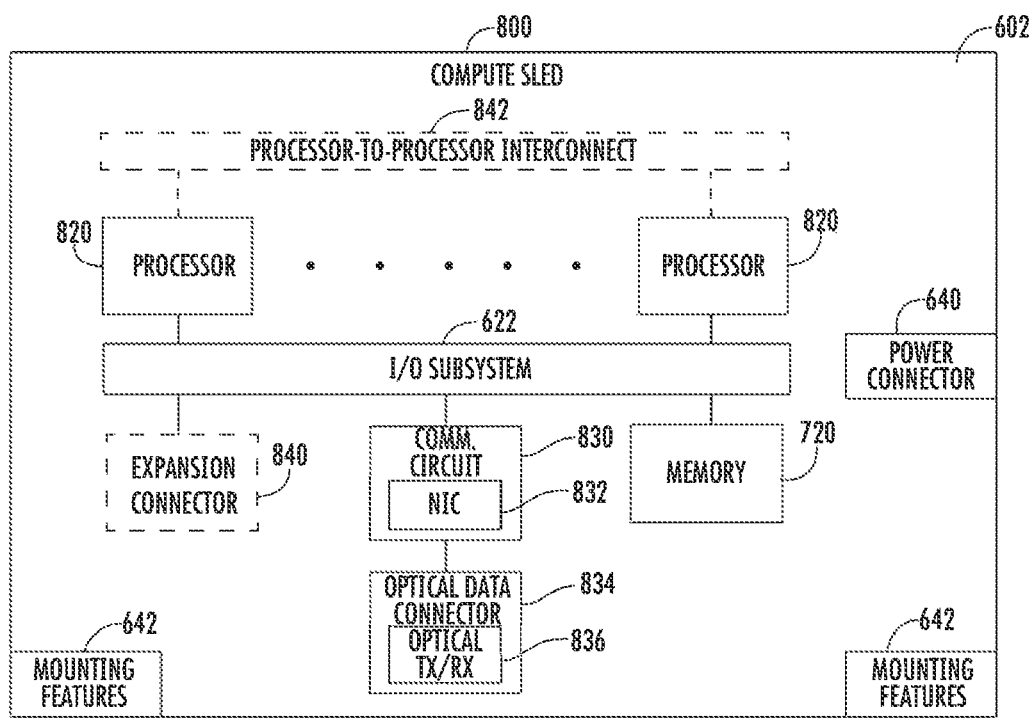
FIG. 8 is a simplified block diagram of at least one embodiment of a compute sled usable in the data center of FIG. 1.

Referring now to FIG. 8, in some embodiments, the sled 400 may be embodied as a compute sled 800. The compute sled 800 is optimized, or otherwise configured, to perform compute tasks. Of course, as discussed above, the compute sled 800 may rely on other sleds, such as acceleration sleds and/or storage sleds, to perform such compute tasks. The compute sled 800 includes various physical resources (e.g., electrical components) similar to the physical resources of the sled 400, which have been identified in FIG. 8 using the same reference numbers. The description of such components provided above in regard to FIGS. 6 and 7 applies to the corresponding components of the compute sled 800 and is not repeated herein for clarity of the description of the compute sled 800.

In the illustrative compute sled 800, the physical resources 620 are embodied as processors 820. Although only two processors 820 are shown in FIG. 8, it should be appreciated that the compute sled 800 may include additional processors 820 in other embodiments. Illustratively, the processors 820 are embodied as high-performance processors 820 and may be configured to operate at a relatively high power rating. Although the processors 820 generate additional heat operating at power ratings greater than typical processors (which operate at around 155-230 W), the enhanced thermal cooling characteristics of the chassis-less circuit board substrate 602 discussed above facilitate the higher power operation. For example, in the illustrative embodiment, the processors 820 are configured to operate at a power rating of at least 250 W. In some embodiments, the processors 820 may be configured to operate at a power rating of at least 350 W.

In some embodiments, the compute sled 800 may also include a processor-to-processor interconnect 842. Similar to the resource-to-resource interconnect 624 of the sled 400 discussed above, the processor-to-processor interconnect 842 may be embodied as any type of communication interconnect capable of facilitating processor-to-processor interconnect 842 communications. In the illustrative embodiment, the processor-to-processor interconnect 842 is embodied as a high-speed point-to-point interconnect (e.g., faster than the I/O subsystem 622). For example, the processor-to-processor interconnect 842 may be embodied as a QuickPath Interconnect (QPI), an UltraPath Interconnect (UPI), or other high-speed point-to-point interconnect dedicated to processor-to-processor communications.

The compute sled 800 also includes a communication circuit 830. The illustrative communication circuit 830 includes a network interface controller (NIC) 832, which may also be referred to as a host fabric interface (HFI). The NIC 832 may be embodied as, or otherwise include, any type of integrated circuit, discrete circuits, controller chips, chipsets, add-in-boards, daughtercards, network interface cards, or other devices that may be used by the compute sled 800 to connect with another compute device (e.g., with other sleds 400). In some embodiments, the NIC 832 may be embodied as part of a system-on-a-chip (SoC) that includes one or more processors, or included on a multichip package that also contains one or more processors. In some embodiments, the NIC 832 may include a local processor (not shown) and/or a local memory (not shown) that are both local to the NIC 832. In such embodiments, the local processor of the NIC 832 may be capable of performing one or more of the functions of the processors 820. Additionally or alternatively, in such embodiments, the local memory of the NIC 832 may be integrated into one or more components of the compute sled at the board level, socket level, chip level, and/or other levels.

The communication circuit 830 is communicatively coupled to an optical data connector 834. The optical data connector 834 is configured to mate with a corresponding optical data connector of the rack 240 when the compute sled 800 is mounted in the rack 240. Illustratively, the optical data connector 834 includes a plurality of optical fibers which lead from a mating surface of the optical data connector 834 to an optical transceiver 836. The optical transceiver 836 is configured to convert incoming optical signals from the rack-side optical data connector to electrical signals and to convert electrical signals to outgoing optical signals to the rack-side optical data connector. Although shown as forming part of the optical data connector 834 in the illustrative embodiment, the optical transceiver 836 may form a portion of the communication circuit 830 in other embodiments.

In some embodiments, the compute sled 800 may also include an expansion connector 840. In such embodiments, the expansion connector 840 is configured to mate with a corresponding connector of an expansion chassis-less circuit board substrate to provide additional physical resources to the compute sled 800. The additional physical resources may be used, for example, by the processors 820 during operation of the compute sled 800. The expansion chassis-less circuit board substrate may be substantially similar to the chassis-less circuit board substrate 602 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 9:
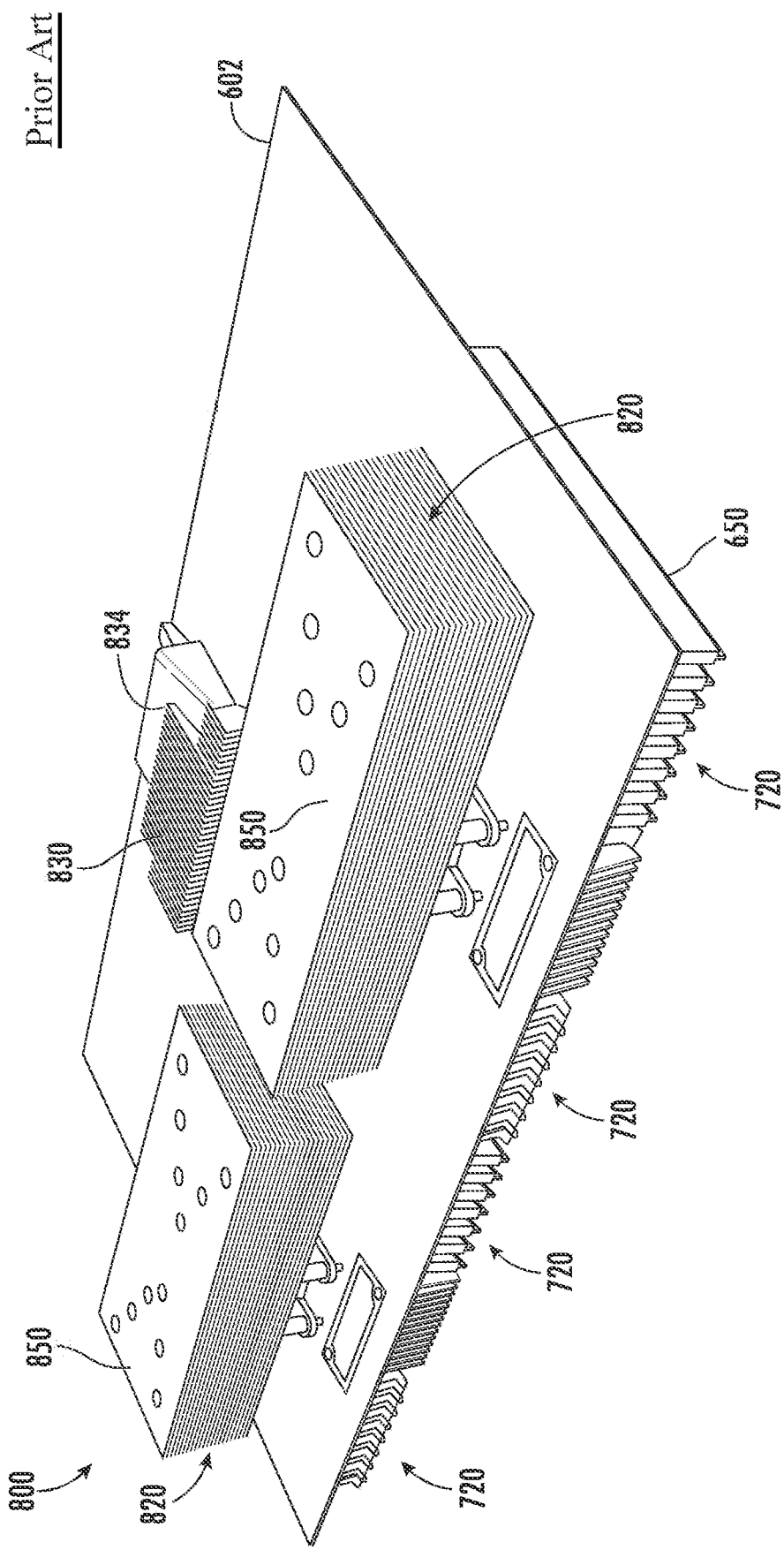
FIG. 9 is a top perspective view of at least one embodiment of the compute sled of FIG. 8.

Referring now to FIG. 9, an illustrative embodiment of the compute sled 800 is shown. As shown, the processors 820, communication circuit 830, and optical data connector 834 are mounted to the top side 650 of the chassis-less circuit board substrate 602. Any suitable attachment or mounting technology may be used to mount the physical resources of the compute sled 800 to the chassis-less circuit board substrate 602. For example, the various physical resources may be mounted in corresponding sockets (e.g., a processor socket), holders, or brackets. In some cases, some of the electrical components may be directly mounted to the chassis-less circuit board substrate 602 via soldering or similar techniques.

As discussed above, the individual processors 820 and communication circuit 830 are mounted to the top side 650 of the chassis-less circuit board substrate 602 such that no two heat-producing, electrical components shadow each other. In the illustrative embodiment, the processors 820 and communication circuit 830 are mounted in corresponding locations on the top side 650 of the chassis-less circuit board substrate 602 such that no two of those physical resources are linearly in-line with others along the direction of the airflow path 608. It should be appreciated that, although the optical data connector 834 is in-line with the communication circuit 830, the optical data connector 834 produces no or nominal heat during operation.

The memory devices 720 of the compute sled 800 are mounted to the bottom side 750 of the of the chassis-less circuit board substrate 602 as discussed above in regard to the sled 400. Although mounted to the bottom side 750, the memory devices 720 are communicatively coupled to the processors 820 located on the top side 650 via the I/O subsystem 622. Because the chassis-less circuit board substrate 602 is embodied as a double-sided circuit board, the memory devices 720 and the processors 820 may be communicatively coupled by one or more vias, connectors, or other mechanisms extending through the chassis-less circuit board substrate 602. Of course, each processor 820 may be communicatively coupled to a different set of one or more memory devices 720 in some embodiments. Alternatively, in other embodiments, each processor 820 may be communicatively coupled to each memory device 720. In some embodiments, the memory devices 720 may be mounted to one or more memory mezzanines on the bottom side of the chassis-less circuit board substrate 602 and may interconnect with a corresponding processor 820 through a ball-grid array.

Each of the processors 820 includes a heatsink 850 secured thereto. Due to the mounting of the memory devices 720 to the bottom side 750 of the chassis-less circuit board substrate 602 (as well as the vertical spacing of the sleds 400 in the corresponding rack 240), the top side 650 of the chassis-less circuit board substrate 602 includes additional "free" area or space that facilitates the use of heatsinks 850 having a larger size relative to traditional heatsinks used in typical servers. Additionally, due to the improved thermal cooling characteristics of the chassis-less circuit board substrate 602, none of the processor heatsinks 850 include cooling fans attached thereto. That is, each of the heatsinks 850 is embodied as a fan-less heatsink. In some embodiments, the heat sinks 850 mounted atop the processors 820 may overlap with the heat sink attached to the communication circuit 830 in the direction of the airflow path 608 due to their increased size, as illustratively suggested by FIG. 9.

Figure 10:
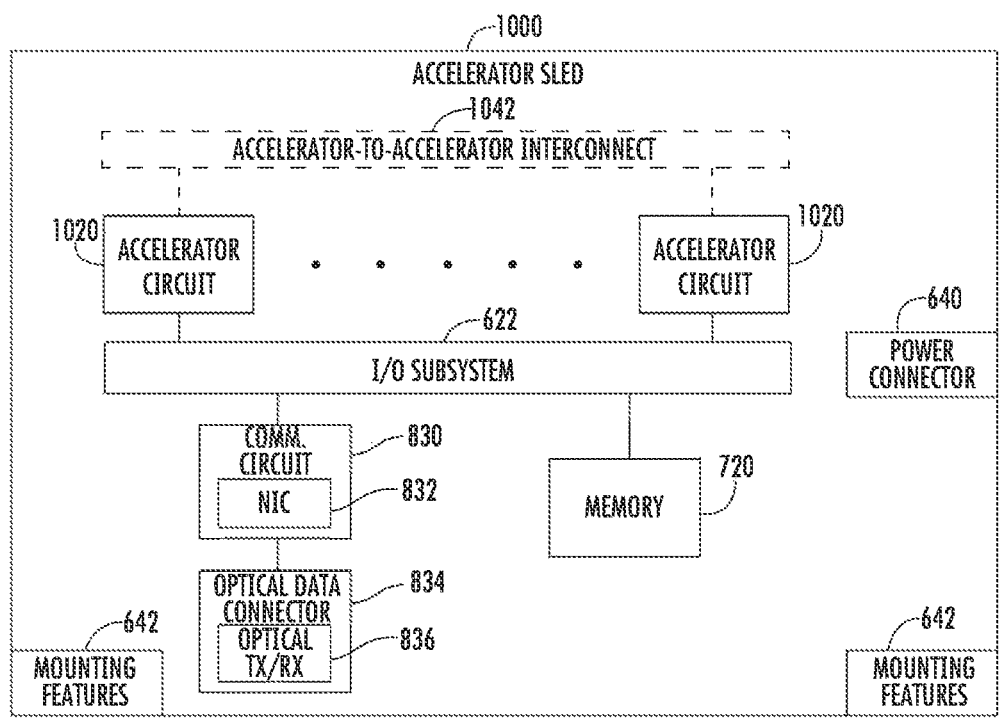
FIG. 10 is a simplified block diagram of at least one embodiment of an accelerator sled usable in the data center of FIG. 1.

Referring now to FIG. 10, in some embodiments, the sled 400 may be embodied as an accelerator sled 1000. The accelerator sled 1000 is configured, to perform specialized compute tasks, such as machine learning, encryption, hashing, or other computational-intensive task. In some embodiments, for example, a compute sled 800 may offload tasks to the accelerator sled 1000 during operation. The accelerator sled 1000 includes various components similar to components of the sled 400 and/or compute sled 800, which have been identified in FIG. 10 using the same reference numbers. The description of such components provided above in regard to FIGS. 6, 7, and 8 apply to the corresponding components of the accelerator sled 1000 and is not repeated herein for clarity of the description of the accelerator sled 1000.

Figure 11:
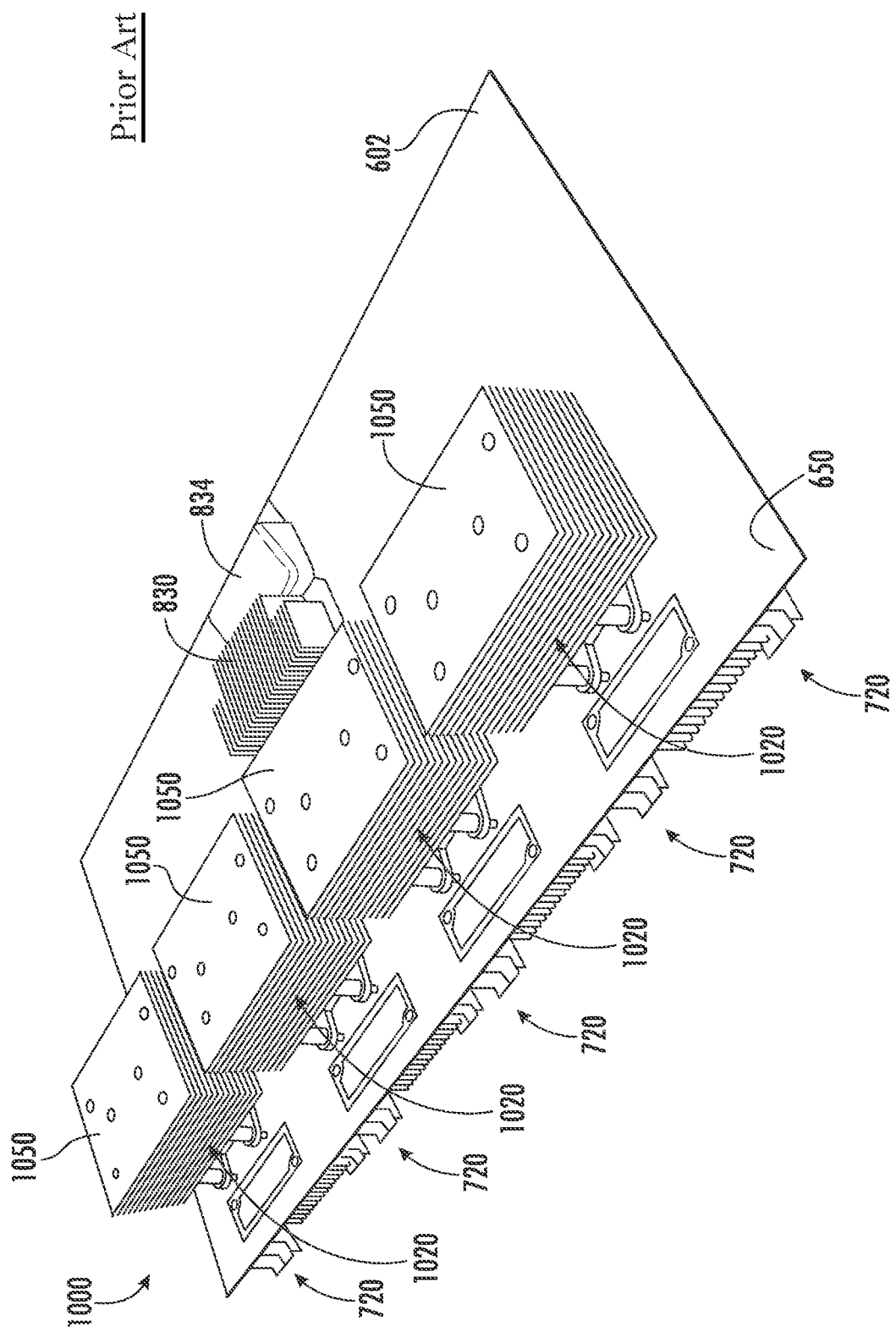
FIG. 11 is a top perspective view of at least one embodiment of the accelerator sled of FIG. 10.

In the illustrative accelerator sled 1000, the physical resources 620 are embodied as accelerator circuits 1020. Although only two accelerator circuits 1020 are shown in FIG. 10, it should be appreciated that the accelerator sled 1000 may include additional accelerator circuits 1020 in other embodiments. For example, as shown in FIG. 11, the accelerator sled 1000 may include four accelerator circuits 1020 in some embodiments. The accelerator circuits 1020 may be embodied as any type of processor, co-processor, compute circuit, or other device capable of performing compute or processing operations. For example, the accelerator circuits 1020 may be embodied as, for example, field programmable gate arrays (FPGA), application-specific integrated circuits (ASICs), security co-processors, graphics processing units (GPUs), neuromorphic processor units, quantum computers, machine learning circuits, or other specialized processors, controllers, devices, and/or circuits.

In some embodiments, the accelerator sled 1000 may also include an accelerator-to-accelerator interconnect 1042. Similar to the resource-to-resource interconnect 624 of the sled 600 discussed above, the accelerator-to-accelerator interconnect 1042 may be embodied as any type of communication interconnect capable of facilitating accelerator-to-accelerator communications. In the illustrative embodiment, the accelerator-to-accelerator interconnect 1042 is embodied as a high-speed point-to-point interconnect (e.g., faster than the I/O subsystem 622). For example, the accelerator-to-accelerator interconnect 1042 may be embodied as a QuickPath Interconnect (QPI), an UltraPath Interconnect (UPI), or other high-speed point-to-point interconnect dedicated to processor-to-processor communications. In some embodiments, the accelerator circuits 1020 may be daisy-chained with a primary accelerator circuit 1020 connected to the NIC 832 and memory 720 through the I/O subsystem 622 and a secondary accelerator circuit 1020 connected to the NIC 832 and memory 720 through a primary accelerator circuit 1020.

Referring now to FIG. 11, an illustrative embodiment of the accelerator sled 1000 is shown. As discussed above, the accelerator circuits 1020, communication circuit 830, and optical data connector 834 are mounted to the top side 650 of the chassis-less circuit board substrate 602. Again, the individual accelerator circuits 1020 and communication circuit 830 are mounted to the top side 650 of the chassis-less circuit board substrate 602 such that no two heat-producing, electrical components shadow each other as discussed above. The memory devices 720 of the accelerator sled 1000 are mounted to the bottom side 750 of the of the chassis-less circuit board substrate 602 as discussed above in regard to the sled 600. Although mounted to the bottom side 750, the memory devices 720 are communicatively coupled to the accelerator circuits 1020 located on the top side 650 via the I/O subsystem 622 (e.g., through vias). Further, each of the accelerator circuits 1020 may include a heatsink 1070 that is larger than a traditional heatsink used in a server. As discussed above with reference to the heatsinks 870, the heatsinks 1070 may be larger than traditional heatsinks because of the "free" area provided by the memory resources 720 being located on the bottom side 750 of the chassis-less circuit board substrate 602 rather than on the top side 650.

Figure 12:
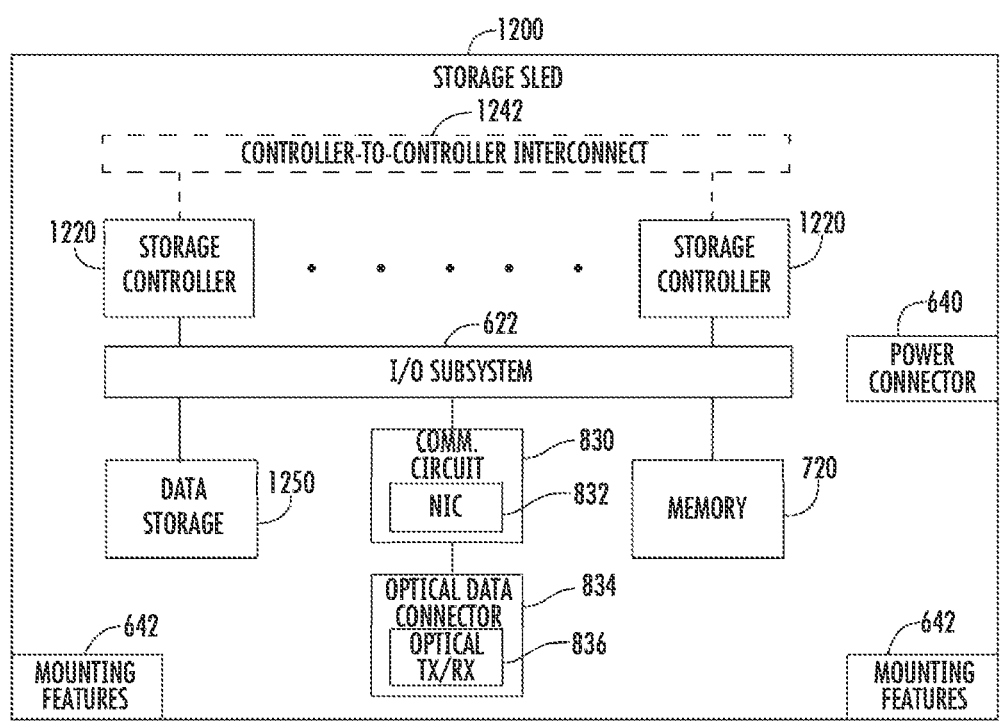
FIG. 12 is a simplified block diagram of at least one embodiment of a storage sled usable in the data center of FIG. 1.

Referring now to FIG. 12, in some embodiments, the sled 400 may be embodied as a storage sled 1200. The storage sled 1200 is configured, to store data in a data storage 1250 local to the storage sled 1200. For example, during operation, a compute sled 800 or an accelerator sled 1000 may store and retrieve data from the data storage 1250 of the storage sled 1200. The storage sled 1200 includes various components similar to components of the sled 400 and/or the compute sled 800, which have been identified in FIG. 12 using the same reference numbers. The description of such components provided above in regard to FIGS. 6, 7, and 8 apply to the corresponding components of the storage sled 1200 and is not repeated herein for clarity of the description of the storage sled 1200.

In the illustrative storage sled 1200, the physical resources 620 are embodied as storage controllers 1220. Although only two storage controllers 1220 are shown in FIG. 12, it should be appreciated that the storage sled 1200 may include additional storage controllers 1220 in other embodiments. The storage controllers 1220 may be embodied as any type of processor, controller, or control circuit capable of controlling the storage and retrieval of data into the data storage 1250 based on requests received via the communication circuit 830. In the illustrative embodiment, the storage controllers 1220 are embodied as relatively low-power processors or controllers. For example, in some embodiments, the storage controllers 1220 may be configured to operate at a power rating of about 75 watts.

In some embodiments, the storage sled 1200 may also include a controller-to-controller interconnect 1242. Similar to the resource-to-resource interconnect 624 of the sled 400 discussed above, the controller-to-controller interconnect 1242 may be embodied as any type of communication interconnect capable of facilitating controller-to-controller communications. In the illustrative embodiment, the controller-to-controller interconnect 1242 is embodied as a high-speed point-to-point interconnect (e.g., faster than the I/O subsystem 622). For example, the controller-to-controller interconnect 1242 may be embodied as a QuickPath Interconnect (QPI), an UltraPath Interconnect (UPI), or other high-speed point-to-point interconnect dedicated to processor-to-processor communications.

Figure 13:
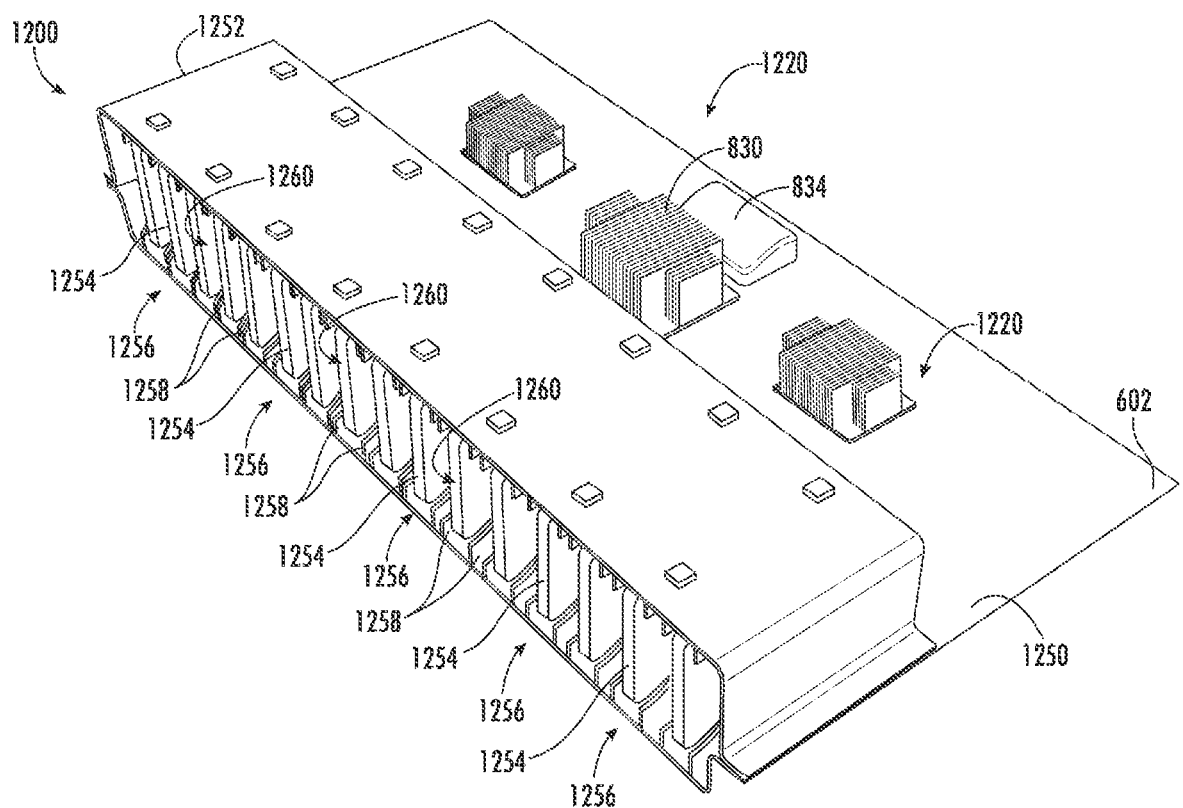
FIG. 13 is a top perspective view of at least one embodiment of the storage sled of FIG. 12.

Referring now to FIG. 13, an illustrative embodiment of the storage sled 1200 is shown. In the illustrative embodiment, the data storage 1250 is embodied as, or otherwise includes, a storage cage 1252 configured to house one or more solid state drives (SSDs) 1254. To do so, the storage cage 1252 includes a number of mounting slots 1256, each of which is configured to receive a corresponding solid state drive 1254. Each of the mounting slots 1256 includes a number of drive guides 1258 that cooperate to define an access opening 1260 of the corresponding mounting slot 1256. The storage cage 1252 is secured to the chassis-less circuit board substrate 602 such that the access openings face away from (i.e., toward the front of) the chassis-less circuit board substrate 602. As such, solid state drives 1254 are accessible while the storage sled 1200 is mounted in a corresponding rack 204. For example, a solid state drive 1254 may be swapped out of a rack 240 (e.g., via a robot) while the storage sled 1200 remains mounted in the corresponding rack 240.

The storage cage 1252 illustratively includes sixteen mounting slots 1256 and is capable of mounting and storing sixteen solid state drives 1254. Of course, the storage cage 1252 may be configured to store additional or fewer solid state drives 1254 in other embodiments. Additionally, in the illustrative embodiment, the solid state drivers are mounted vertically in the storage cage 1252, but may be mounted in the storage cage 1252 in a different orientation in other embodiments. Each solid state drive 1254 may be embodied as any type of data storage device capable of storing long term data. To do so, the solid state drives 1254 may include volatile and non-volatile memory devices discussed above.

As shown in FIG. 13, the storage controllers 1220, the communication circuit 830, and the optical data connector 834 are illustratively mounted to the top side 650 of the chassis-less circuit board substrate 602. Again, as discussed above, any suitable attachment or mounting technology may be used to mount the electrical components of the storage sled 1200 to the chassis-less circuit board substrate 602 including, for example, sockets (e.g., a processor socket), holders, brackets, soldered connections, and/or other mounting or securing techniques.

As discussed above, the individual storage controllers 1220 and the communication circuit 830 are mounted to the top side 650 of the chassis-less circuit board substrate 602 such that no two heat-producing, electrical components shadow each other. For example, the storage controllers 1220 and the communication circuit 830 are mounted in corresponding locations on the top side 650 of the chassis-less circuit board substrate 602 such that no two of those electrical components are linearly in-line with each other along the direction of the airflow path 608.

The memory devices 720 of the storage sled 1200 are mounted to the bottom side 750 of the of the chassis-less circuit board substrate 602 as discussed above in regard to the sled 400. Although mounted to the bottom side 750, the memory devices 720 are communicatively coupled to the storage controllers 1220 located on the top side 650 via the I/O subsystem 622. Again, because the chassis-less circuit board substrate 602 is embodied as a double-sided circuit board, the memory devices 720 and the storage controllers 1220 may be communicatively coupled by one or more vias, connectors, or other mechanisms extending through the chassis-less circuit board substrate 602. Each of the storage controllers 1220 includes a heatsink 1270 secured thereto. As discussed above, due to the improved thermal cooling characteristics of the chassis-less circuit board substrate 602 of the storage sled 1200, none of the heatsinks 1270 include cooling fans attached thereto. That is, each of the heatsinks 1270 is embodied as a fan-less heatsink.

Figure 14:
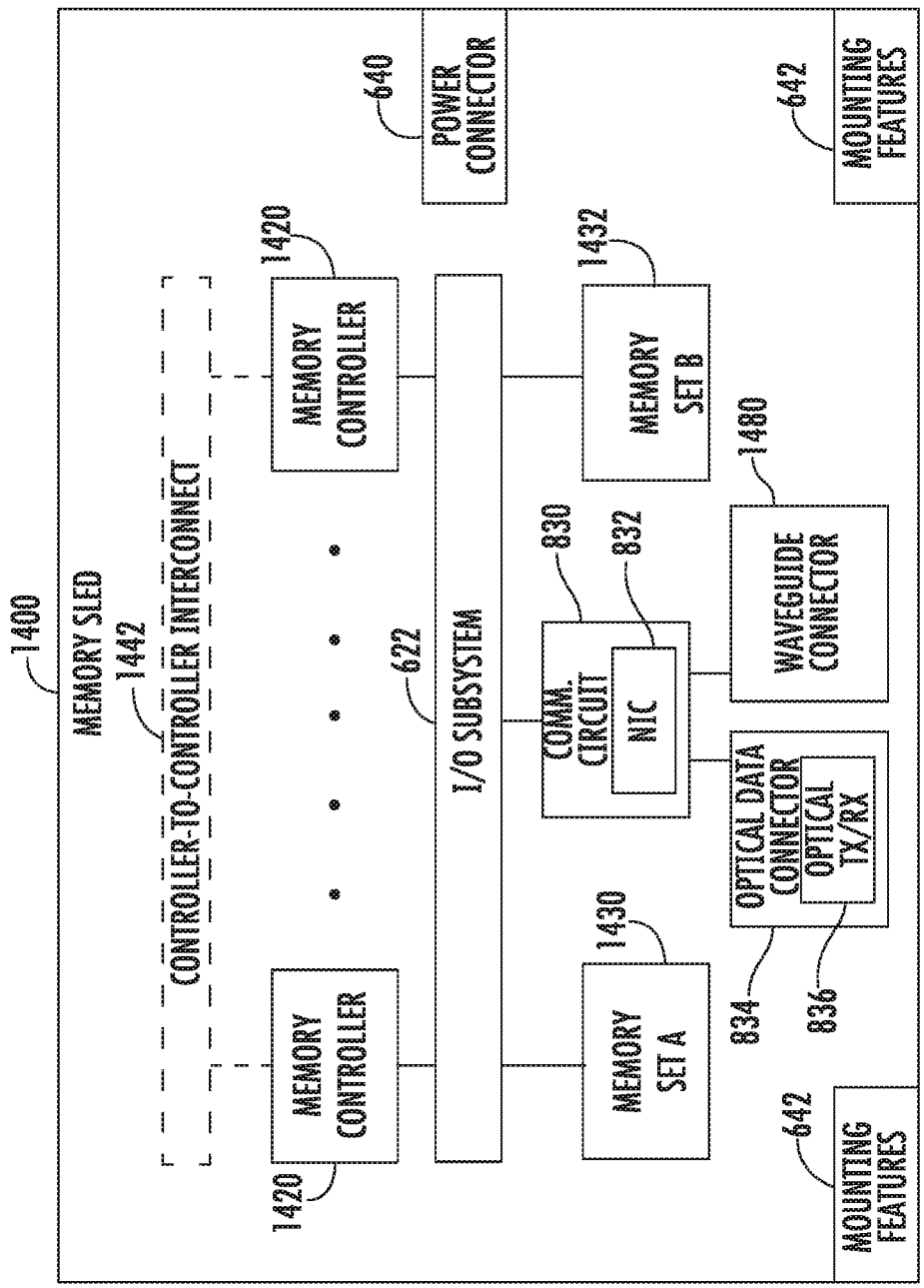
FIG. 14 is a simplified block diagram of at least one embodiment of a memory sled usable in the data center of FIG. 1.

Referring now to FIG. 14, in some embodiments, the sled 400 may be embodied as a memory sled 1400. The storage sled 1400 is optimized, or otherwise configured, to provide other sleds 400 (e.g., compute sleds 800, accelerator sleds 1000, etc.) with access to a pool of memory (e.g., in two or more sets 1430, 1432 of memory devices 720) local to the memory sled 1200. For example, during operation, a compute sled 800 or an accelerator sled 1000 may remotely write to and/or read from one or more of the memory sets 1430, 1432 of the memory sled 1200 using a logical address space that maps to physical addresses in the memory sets 1430, 1432. The memory sled 1400 includes various components similar to components of the sled 400 and/or the compute sled 800, which have been identified in FIG. 14 using the same reference numbers. The description of such components provided above in regard to FIGS. 6, 7, and 8 apply to the corresponding components of the memory sled 1400 and is not repeated herein for clarity of the description of the memory sled 1400.

In the illustrative memory sled 1400, the physical resources 620 are embodied as memory controllers 1420. Although only two memory controllers 1420 are shown in FIG. 14, it should be appreciated that the memory sled 1400 may include additional memory controllers 1420 in other embodiments. The memory controllers 1420 may be embodied as any type of processor, controller, or control circuit capable of controlling the writing and reading of data into the memory sets 1430, 1432 based on requests received via the communication circuit 830. In the illustrative embodiment, each memory controller 1420 is connected to a corresponding memory set 1430, 1432 to write to and read from memory devices 720 within the corresponding memory set 1430, 1432 and enforce any permissions (e.g., read, write, etc.) associated with sled 400 that has sent a request to the memory sled 1400 to perform a memory access operation (e.g., read or write).

In some embodiments, the memory sled 1400 may also include a controller-to-controller interconnect 1442. Similar to the resource-to-resource interconnect 624 of the sled 400 discussed above, the controller-to-controller interconnect 1442 may be embodied as any type of communication interconnect capable of facilitating controller-to-controller communications. In the illustrative embodiment, the controller-to-controller interconnect 1442 is embodied as a high-speed point-to-point interconnect (e.g., faster than the I/O subsystem 622). For example, the controller-to-controller interconnect 1442 may be embodied as a QuickPath Interconnect (QPI), an UltraPath Interconnect (UPI), or other high-speed point-to-point interconnect dedicated to processor-to-processor communications. As such, in some embodiments, a memory controller 1420 may access, through the controller-to-controller interconnect 1442, memory that is within the memory set 1432 associated with another memory controller 1420. In some embodiments, a scalable memory controller is made of multiple smaller memory controllers, referred to herein as "chiplets", on a memory sled (e.g., the memory sled 1400). The chiplets may be interconnected (e.g., using EMIB (Embedded Multi-Die Interconnect Bridge)). The combined chiplet memory controller may scale up to a relatively large number of memory controllers and I/O ports, (e.g., up to 16 memory channels). In some embodiments, the memory controllers 1420 may implement a memory interleave (e.g., one memory address is mapped to the memory set 1430, the next memory address is mapped to the memory set 1432, and the third address is mapped to the memory set 1430, etc.). The interleaving may be managed within the memory controllers 1420, or from CPU sockets (e.g., of the compute sled 800) across network links to the memory sets 1430, 1432, and may improve the latency associated with performing memory access operations as compared to accessing contiguous memory addresses from the same memory device.

Further, in some embodiments, the memory sled 1400 may be connected to one or more other sleds 400 (e.g., in the same rack 240 or an adjacent rack 240) through a waveguide, using the waveguide connector 1480. In the illustrative embodiment, the waveguides are 64 millimeter waveguides that provide 16 Rx (i.e., receive) lanes and 16 Tx (i.e., transmit) lanes. Each lane, in the illustrative embodiment, is either 16 GHz or 32 GHz. In other embodiments, the frequencies may be different. Using a waveguide may provide high throughput access to the memory pool (e.g., the memory sets 1430, 1432) to another sled (e.g., a sled 400 in the same rack 240 or an adjacent rack 240 as the memory sled 1400) without adding to the load on the optical data connector 834.

Figure 15:
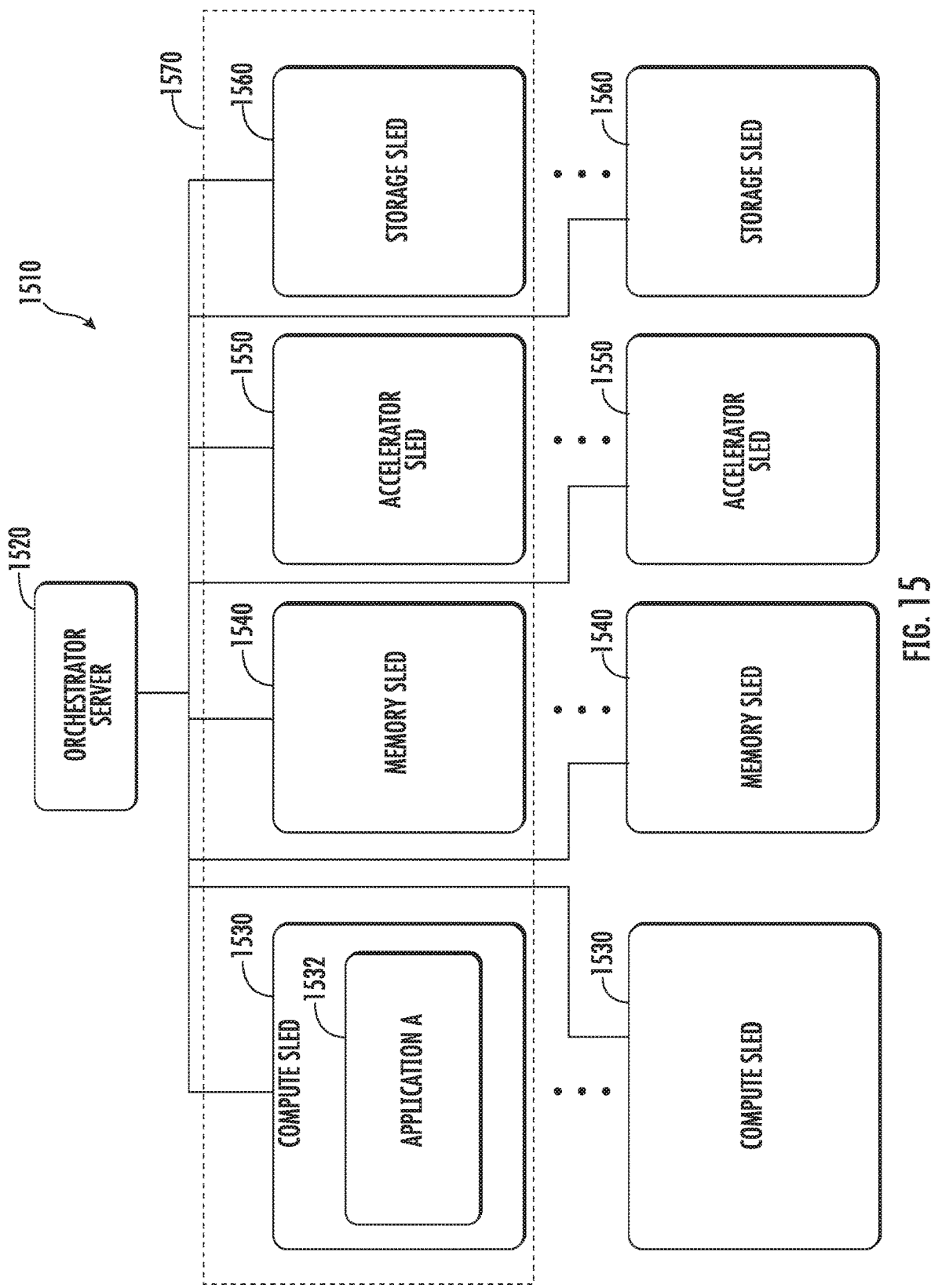
FIG. 15 is a simplified block diagram of a system that may be established within the data center of FIG. 1 to execute workloads with managed nodes composed of disaggregated resources.

Referring now to FIG. 15, a system for executing one or more workloads (e.g., applications) may be implemented in accordance with the data center 100. In the illustrative embodiment, the system 1510 includes an orchestrator server 1520, which may be embodied as a managed node comprising a compute device (e.g., a processor 820 on a compute sled 800) executing management software (e.g., a cloud operating environment, such as OpenStack) that is communicatively coupled to multiple sleds 400 including a large number of compute sleds 1530 (e.g., each similar to the compute sled 800), memory sleds 1540 (e.g., each similar to the memory sled 1400), accelerator sleds 1550 (e.g., each similar to the memory sled 1000), and storage sleds 1560 (e.g., each similar to the storage sled 1200). One or more of the sleds 1530, 1540, 1550, 1560 may be grouped into a managed node 1570, such as by the orchestrator server 1520, to collectively perform a workload (e.g., an application 1532 executed in a virtual machine or in a container). The managed node 1570 may be embodied as an assembly of physical resources 620, such as processors 820, memory resources 720, accelerator circuits 1020, or data storage 1250, from the same or different sleds 400. Further, the managed node may be established, defined, or "spun up" by the orchestrator server 1520 at the time a workload is to be assigned to the managed node or at any other time, and may exist regardless of whether any workloads are presently assigned to the managed node. In the illustrative embodiment, the orchestrator server 1520 may selectively allocate and/or deallocate physical resources 620 from the sleds 400 and/or add or remove one or more sleds 400 from the managed node 1570 as a function of quality of service (QoS) targets (e.g., performance targets associated with a throughput, latency, instructions per second, etc.) associated with a service level agreement for the workload (e.g., the application 1532). In doing so, the orchestrator server 1520 may receive telemetry data indicative of performance conditions (e.g., throughput, latency, instructions per second, etc.) in each sled 400 of the managed node 1570 and compare the telemetry data to the quality of service targets to determine whether the quality of service targets are being satisfied. The orchestrator server 1520 may additionally determine whether one or more physical resources may be deallocated from the managed node 1570 while still satisfying the QoS targets, thereby freeing up those physical resources for use in another managed node (e.g., to execute a different workload). Alternatively, if the QoS targets are not presently satisfied, the orchestrator server 1520 may determine to dynamically allocate additional physical resources to assist in the execution of the workload (e.g., the application 1532) while the workload is executing. Similarly, the orchestrator server 1520 may determine to dynamically deallocate physical resources from a managed node if the orchestrator server 1520 determines that deallocating the physical resource would result in QoS targets still being met.

Additionally, in some embodiments, the orchestrator server 1520 may identify trends in the resource utilization of the workload (e.g., the application 1532), such as by identifying phases of execution (e.g., time periods in which different operations, each having different resource utilizations characteristics, are performed) of the workload (e.g., the application 1532) and pre-emptively identifying available resources in the data center 100 and allocating them to the managed node 1570 (e.g., within a predefined time period of the associated phase beginning). In some embodiments, the orchestrator server 1520 may model performance based on various latencies and a distribution scheme to place workloads among compute sleds and other resources (e.g., accelerator sleds, memory sleds, storage sleds) in the data center 100. For example, the orchestrator server 1520 may utilize a model that accounts for the performance of resources on the sleds 400 (e.g., FPGA performance, memory access latency, etc.) and the performance (e.g., congestion, latency, bandwidth) of the path through the network to the resource (e.g., FPGA). As such, the orchestrator server 1520 may determine which resource(s) should be used with which workloads based on the total latency associated with each potential resource available in the data center 100 (e.g., the latency associated with the performance of the resource itself in addition to the latency associated with the path through the network between the compute sled executing the workload and the sled 400 on which the resource is located).

In some embodiments, the orchestrator server 1520 may generate a map of heat generation in the data center 100 using telemetry data (e.g., temperatures, fan speeds, etc.) reported from the sleds 400 and allocate resources to managed nodes as a function of the map of heat generation and predicted heat generation associated with different workloads, to maintain a target temperature and heat distribution in the data center 100. Additionally or alternatively, in some embodiments, the orchestrator server 1520 may organize received telemetry data into a hierarchical model that is indicative of a relationship between the managed nodes (e.g., a spatial relationship such as the physical locations of the resources of the managed nodes within the data center 100 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1520 may determine the differences based on the telemetry data stored in the hierarchical model and factor the differences into a prediction of future resource utilization of a workload if the workload is reassigned from one managed node to another managed node, to accurately balance resource utilization in the data center 100.

To reduce the computational load on the orchestrator server 1520 and the data transfer load on the network, in some embodiments, the orchestrator server 1520 may send self-test information to the sleds 400 to enable each sled 400 to locally (e.g., on the sled 400) determine whether telemetry data generated by the sled 400 satisfies one or more conditions (e.g., an available capacity that satisfies a predefined threshold, a temperature that satisfies a predefined threshold, etc.). Each sled 400 may then report back a simplified result (e.g., yes or no) to the orchestrator server 1520, which the orchestrator server 1520 may utilize in determining the allocation of resources to managed nodes.

Figure 16:
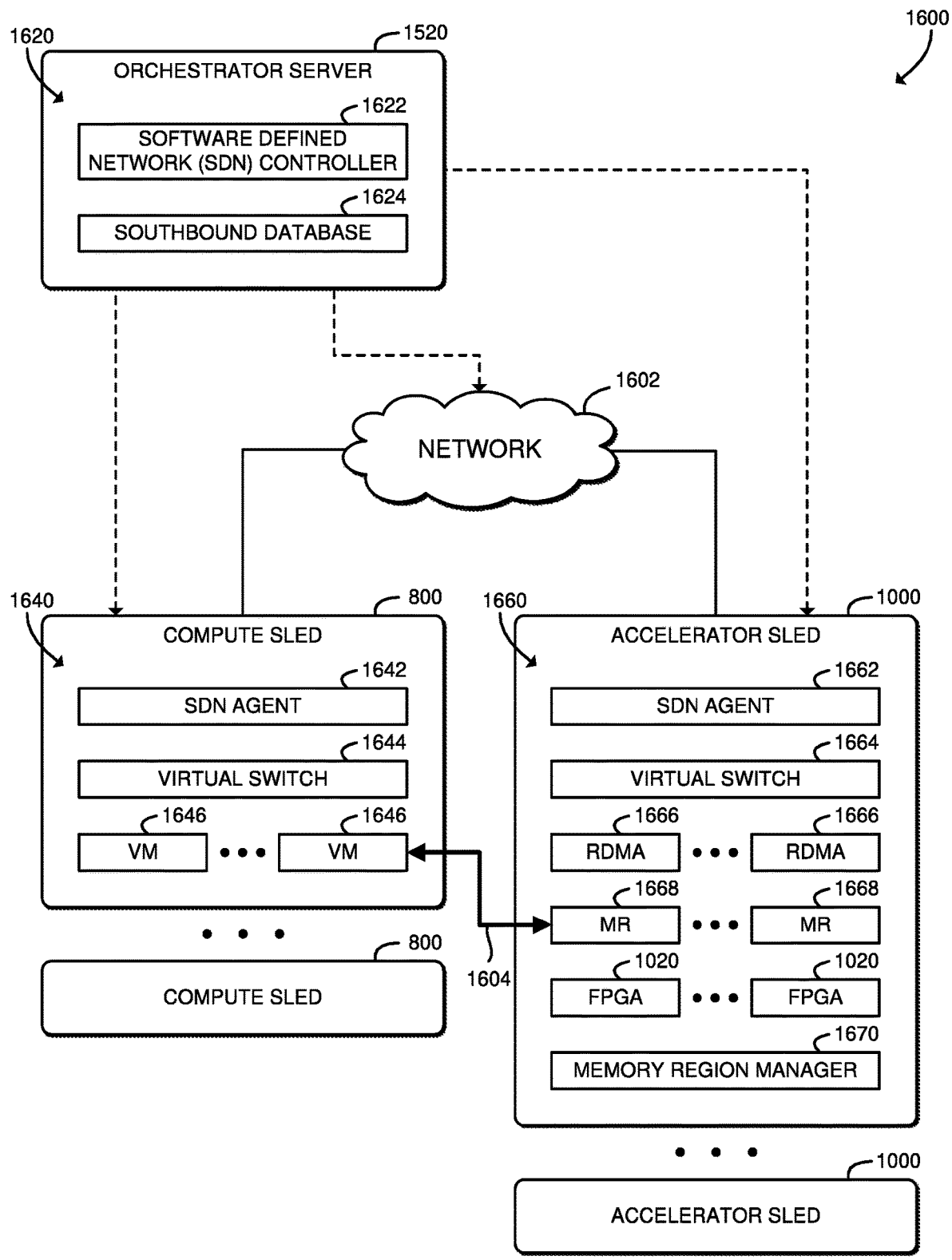
FIG. 16 is a simplified block diagram of at least one embodiment of a system for managing disaggregated accelerator networks.

Referring now to FIG. 16, an illustrative system 1600 for managing disaggregated accelerator networks includes an orchestrator server 1520, multiple compute sleds 800, and multiple accelerator sleds 1000 in communication over a network 1602. In use, as described further below, an accelerator sled 1000 creates a remote direct memory access (RDMA) memory region associated with each accelerator circuit 1020 (e.g., FPGA 1020) and represents the memory region as a virtual switch endpoint that is configurable at a master software-defined networking (SDN) controller of the orchestrator server 1520. The memory region is included when a managed node 1570 is composed that includes a compute sled and the FPGA 1020. Local SDN tables of the sleds 800, 1000 are updated to switch network traffic between an application of the compute sled 800 and the memory region of the accelerator sled 1000. RDMA verbs are used to transfer data from the network traffic with the associated FPGA 1020. Thus, the system exposes each FPGA 1020 as a switchable endpoint to an upper orchestration layer. Further, flow management, failure management due to switch failures, congestion management, and other network management functions may extend to the FPGAs 1020 as endpoints, which may improve network efficiency, reduce delays, and improve ease of network management.

Although illustrated with the orchestrator server 1520, the compute sleds 800, and the accelerator sleds 1000, it should be understood that in some embodiments each of those system elements may be embodied as any type of sled 400 or other compute device capable of performing the functions described herein, such as, without limitation, a sled, a compute sled, an accelerator sled, a storage sled, a computer, a server, a distributed computing device, a disaggregated computing device, a laptop computer, a tablet computer, a notebook computer, a mobile computing device, a smartphone, a wearable computing device, a multiprocessor system, a server, a workstation, and/or a consumer electronic device.

As discussed in more detail below, the elements of the system 1600 are configured to transmit and receive data with each other and/or other devices of the system 1600 over the network 1602. The network 1602 may be embodied as any number of various wired and/or wireless networks. For example, the network 1602 may be embodied as, or otherwise include a wired or wireless local area network (LAN), and/or a wired or wireless wide area network (WAN). As such, the network 1602 may include any number of additional devices, such as additional computers, routers, and switches, to facilitate communications among the devices of the system 1600. As shown, a compute sled 800 and an accelerator sled 1600 may communicate with each other over a virtual tunnel 1604. The virtual tunnel 1604 may be embodied as a virtualized overlay network, such as a Virtual Extensible LAN (VxLAN) tunnel, a Generic Network Virtualization Encapsulation (Geneve) tunnel, or other overlay network. Thus, the network 1602 may be embodied as or otherwise include an underlay network and/or other network infrastructure that carries the virtual tunnel 1604.

As shown in FIG. 16, in an illustrative embodiment, the orchestrator server 1520 establishes an environment 1620 during operation. The illustrative environment 1620 includes an SDN controller 1622 and a southbound database 1624. The various components of the environment 1620 may be embodied as hardware, firmware, software, or a combination thereof. As such, in some embodiments, one or more of the components of the environment 1620 may be embodied as circuitry or collection of electrical devices (e.g., SDN controller circuitry 1622 and/or southbound database circuitry 1624). It should be appreciated that, in such embodiments, one or more of the SDN controller circuitry 1622 and/or the southbound database circuitry 1624 may form a portion of the processor 820, the I/O subsystem 622, the HFI 832, and/or other components of the orchestrator server 1520. Additionally, in some embodiments, one or more of the illustrative components may form a portion of another component and/or one or more of the illustrative components may be independent of one another.

The SDN controller 1622 is configured to manage network connections in the system 1600, including point-to-point tunnels between VMs of the compute sleds 800 and FPGAs of the accelerator sleds 1000. The SDN controller 1622 may be embodied as or otherwise include an Open Virtual Network (OVN) northbound database, an OVN northbound service, a Neutron server, or any other centralized SDN controller and/or orchestration components. The southbound database 1624 is configured to receive updated configuration information from the compute sleds 800, the accelerator sleds 1000, and other elements of the system 1600. The southbound database 1624 may be further configured to push down updated configuration information to the compute sleds 800, the accelerator sleds 1000, and other elements of the system 1600. The southbound database 1624 may be embodied as an OVN southbound database.

Still referring to FIG. 16, in the illustrative embodiment, each compute sled 800 establishes an environment 1640 during operation. The illustrative environment 1640 includes an SDN agent 1642, a virtual switch 1644, and multiple virtual machines (VMs) 1646. The various components of the environment 1640 may be embodied as hardware, firmware, software, or a combination thereof. As such, in some embodiments, one or more of the components of the environment 1640 may be embodied as circuitry or collection of electrical devices (e.g., SDN agent circuitry 1642, virtual switch circuitry 1644, and/or VM circuitry 1646). It should be appreciated that, in such embodiments, one or more of the SDN agent circuitry 1642, the virtual switch circuitry 1644, and/or the VM circuitry 1646 may form a portion of the processor 820, the I/O subsystem 622, the HFI 832, and/or other components of the compute sled 800. Additionally, in some embodiments, one or more of the illustrative components may form a portion of another component and/or one or more of the illustrative components may be independent of one another.

The SDN agent 1642 is configured to update one or more local SDN tables with a virtual tunnel 1604. The SDN agent 1642 may update the local SDN tables in response to receiving a virtual tunnel configuration from a master SDN controller (e.g., the orchestrator server 1520). The virtual tunnel 1604 is associated with the compute sled 1800 and a virtual switch endpoint of the accelerator sled 1000, as described further below. The SDN agent 1642 may be embodied as a local OVN controller or other local SDN agent of the compute sled 800.

The virtual switch 1644 is configured to switch virtual tunnel traffic between the VMs 1646 of the compute sled 800 and the remote accelerator sled 1000 using the local SDN tables. The virtual switch 1644 may be embodied as an Open Virtual Switch (OVS) or other virtual switch of the compute sled 800 that is manageable by the SDN agent 1642.

Each VM 1646 is configured to communicate with a corresponding FPGA 1020 using RDMA verbs (e.g., read, write, or other RDMA operations). RDMA traffic generated by and/or consumed by the VM 1646 is switched by the virtual switch 1644 and transmitted through the network 1602 via the virtual tunnel 1604. Although illustrated as a VM 1646, in some embodiments those functions may be performed by a container, a processor, or other application executed by the compute sled 800.

Still referring to FIG. 16, in the illustrative embodiment, each accelerator sled 1000 establishes an environment 1660 during operation. The illustrative environment 1660 includes an SDN agent 1662, a virtual switch 1664, multiple RDMA server instances 1666, multiple RDMA memory regions (MRs) 1668, and a memory region manager 1670. The various components of the environment 1640 may be embodied as hardware, firmware, software, or a combination thereof. As such, in some embodiments, one or more of the components of the environment 1660 may be embodied as circuitry or collection of electrical devices (e.g., SDN agent circuitry 1662, virtual switch circuitry 1664, RDMA server circuitry 1666, RDMA MR circuitry 1668, and/or memory region manager circuitry 1670). It should be appreciated that, in such embodiments, one or more of the SDN agent circuitry 1662, the virtual switch circuitry 1664, the RDMA server circuitry 1666, the RDMA MR circuitry 1668, and/or the memory region manager circuitry 1670 may form a portion of the processor 820, the I/O subsystem 622, the HFI 832, the FPGAs 1020, and/or other components of the accelerator sled 1000. Additionally, in some embodiments, one or more of the illustrative components may form a portion of another component and/or one or more of the illustrative components may be independent of one another.

As shown, each accelerator sled 1000 also includes multiple FPGAs 1020. Each FPGA 1020 may be embodied as an integrated circuit including programmable digital logic resources that may be configured after manufacture. Each FPGA 1020 may include, for example, a configurable array of logic blocks in communication over a configurable data interchange. Each FPGA 1020 may also include or be coupled to an FPGA memory, which may be embodied as SRAM, DRAM, or other volatile or non-volatile memory of the FPGA 1020. Although illustrated as including FPGAs 1020, it should be understood that in some embodiments the accelerator sled 1000 may include one or more other types of accelerator circuits 1020, such as application-specific integrated circuits (ASICs), graphics processing units (GPUs), coprocessors, or other digital logic devices capable of performing accelerated functions (e.g., accelerated deep packet inspection or other network functions, accelerated cryptographic functions, accelerated data compression, and/or other accelerated functions).

The memory region manager 1670 is configured to create an RDMA memory region 1668 associated with each FPGA 1020. The RDMA memory regions 1668 may be created in response to booting the accelerator sled 1000 or in response to an FGPA 1020 being composed into a managed node 1570 with the compute sled 800. The memory region manager 1670 is further configured to associate an RDMA server instance 1666 with each of the RDMA memory regions 1668. The memory region manager 1670 is further configured to configure a virtual switch endpoint associated with each RDMA server instance 1666. The virtual switch endpoints may be embodied as a virtual network device established by an operating system of the compute device (e.g., a Linux® netdev).

The SDN agent 1662 is configured to update a master SDN controller (e.g., the orchestrator server 1520) in response to configuring the first virtual switch endpoints. For example, the SDN agent 1662 may update the southbound database 1624 of the orchestrator server 1520 with data indicative of each first virtual switch endpoint. The SDN agent 1662 is further configured to update one or more local SDN tables with a virtual tunnel 1604 in response to updating the master SDN controller. The virtual tunnel 1604 is associated with the virtual switch endpoint and the remote compute sled 800. The SDN agent 1662 may update the local SDN tables in response to receiving a virtual tunnel configuration from the master SDN controller. The virtual tunnel configuration may be indicative of the NIC port and the RDMA memory region 1668 that is associated with the corresponding FPGA 1020, as well as an IP address of the remote compute sled 800. The SDN agent 1662 may be embodied as a local OVN controller or other local SDN agent of the accelerator sled 1000.

The virtual switch 1664 is configured to switch virtual tunnel traffic from the remote compute sled 800 with the local SDN tables to the corresponding RDMA server instance 1666 via the corresponding virtual switch endpoint. Switching the virtual tunnel traffic may include receiving virtual tunnel traffic from the remote compute sled 800 via the HFI 832, determining whether the virtual tunnel traffic matches a tunnel key associated with a virtual tunnel 1604, de-encapsulating the virtual tunnel traffic to generate one or more RDMA verbs if the virtual tunnel traffic matches the tunnel key, and forwarding the one or more RDMA verbs to the respective RDMA server instance 1666 in response to de-encapsulating the virtual tunnel traffic. The virtual switch 1664 may be embodied as an Open Virtual Switch (OVS) or other virtual switch of the accelerator sled 1000 that is manageable by the SDN agent 1662.

Each RDMA server instance 1666 is configured to transfer data to the corresponding FPGA 1020 using one or more RDMA verbs in response to switching the virtual tunnel traffic. Each RDMA server instance 1666 may be further configured to enforce access control to the associated RDMA memory region 1668 based on the corresponding virtual tunnel 1604 in response to switching the virtual tunnel traffic.

Although illustrated in FIG. 16 with a single virtual tunnel 1604, it should be understood that the system 1600 may include many virtual tunnels 1604. Each virtual tunnel 1604 connects a VM 1646 of a compute sled with an RDMA MR 1668 of an accelerator sled 1000.

Figure 17:
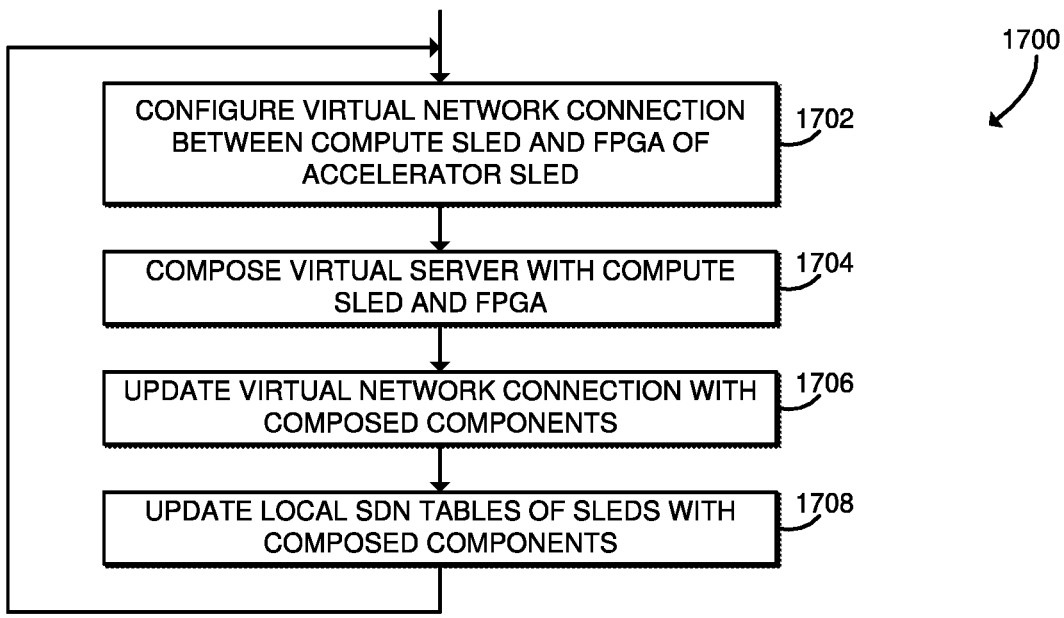
FIG. 17 is a simplified flow diagram of at least one embodiment of a method for managing disaggregated accelerator networks that may be executed by an orchestration server of FIG. 16.

Referring now to FIG. 17, in use, the orchestrator server 1520 may execute a method 1700 for managing disaggregated accelerator networks. It should be appreciated that, in some embodiments, the operations of the method 1700 may be performed by one or more components of the environment 1620 of the orchestrator server 1520 as shown in FIG. 16. The method 1700 begins in block 1702, in which the orchestrator server 1520 configures a virtual network connection between a compute sled 800 and an FPGA 1020 of an accelerator sled 1000. For example, the orchestrator server 1520 may configure a virtual tunnel 1604 in the OVN southbound database or other network management interface. The virtual network connection may be initially configured without referring to a specific chassis or other specific physical infrastructure.

In block 1704, the orchestrator server 1520 composes a virtual server that includes the compute sled 800 and the FPGA 1020. For example, the orchestrator server 1520 may compose a managed node 1570 that includes the compute sled 800 and the FPGA 1020. Composing the virtual server may instantiate or otherwise identify particular instances of the VM 1646 executed by the compute sled 800, the RDMA server instance 1666 and/or RDMA memory region 1668 associated with the FPGA 1020, or other physical and virtual resources of the composed virtual server.

In block 1706, the orchestrator server 1520 updates the virtual network connection with the composed components. For example, the orchestrator server 1520 may update the OVN southbound database or other network management interface with specific chassis information, such as the IP address of the compute sled 800 and/or the VM 1646, the RDMA server instance 1666 and/or RDMA memory region 1668 associated with the FPGA 1020, or other physical infrastructure. In some embodiments, the RDMA memory region 1668 may be attached to a named service configurable at the master controller (e.g., an OVN plugin to Neutron or other network management layer).

In block 1708, the orchestrator server 1520 updates local SDN tables of the compute sled 800 and the accelerator sled 1000 with the composed components. For example, the orchestrator server 1520 may push down updated configuration information from the OVN southbound database to the sleds 800, 1000. The orchestrator server 1520 may also update other components of the system 1600 and/or network 1602 with the updated configuration information. Updating the local SDN tables may establish the virtual tunnel 1604, which enables communication between the VM 1646 and the FPGA 1020 as described further below. After updating the SDN tables, the method 1700 loops back to block 1702, in which the orchestrator server 1520 may configure additional composed nodes.

Figure 18:
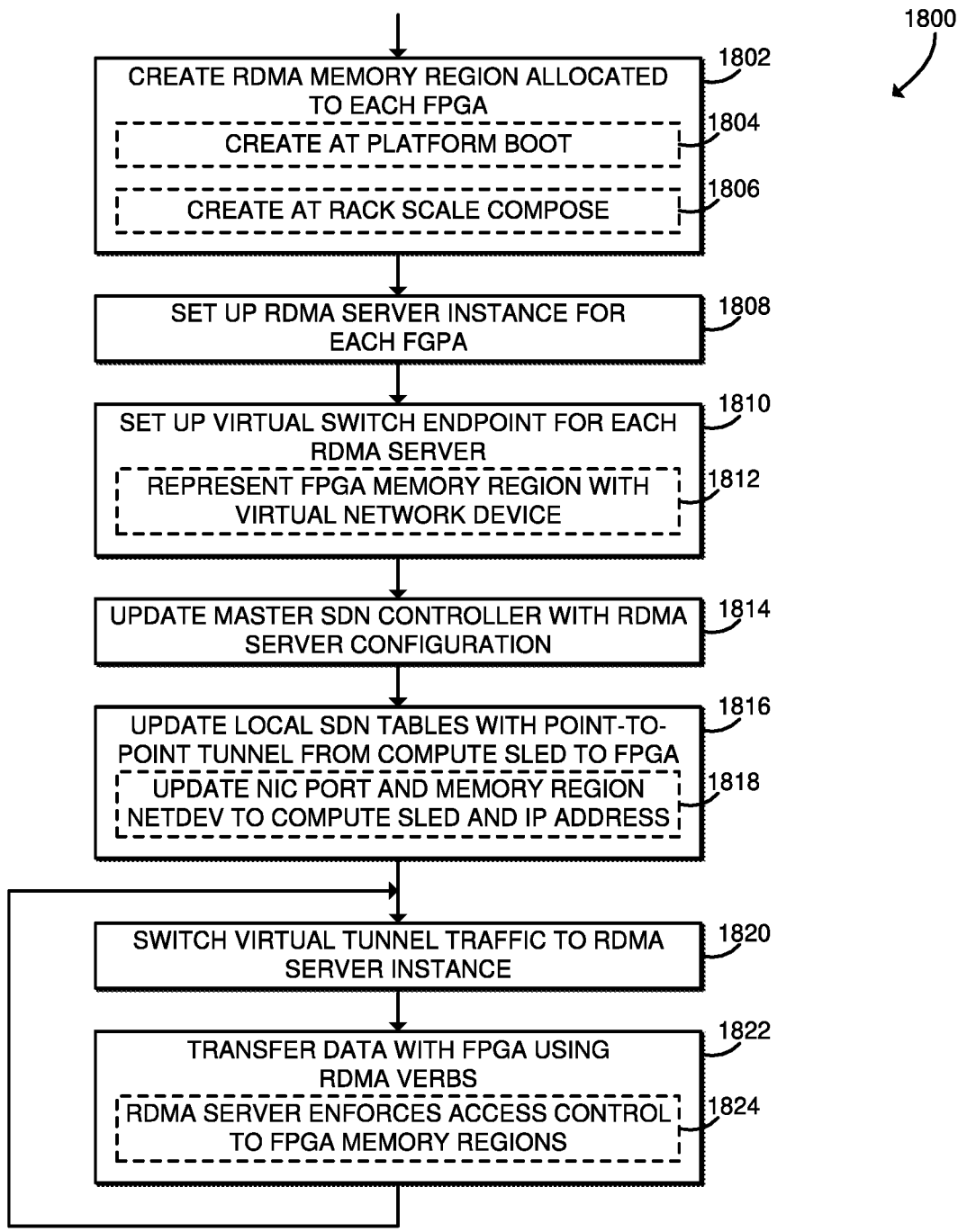
FIG. 18 is a simplified flow diagram of at least one embodiment of a method for managing disaggregated accelerator networks that may be executed by an accelerator sled of FIG. 16.

Referring now to FIG. 18, in use, the accelerator sled 1000 may execute a method 1800 for managing disaggregated accelerator networks. It should be appreciated that, in some embodiments, the operations of the method 1800 may be performed by one or more components of the environment 1660 of the accelerator sled 1000 as shown in FIG. 16. The method 1800 begins in block 1802, in which the accelerator sled 1000 creates an RDMA memory region 1668 that is allocated to each FPGA 1020 or other accelerator device of the accelerator sled 1000. The memory region 1668 may be embodied as a contiguous or non-contiguous region of virtual memory that may be used to communicate data with the corresponding FPGA 1020. In some embodiments, the memory region 1668 may be backed by internal memory or other storage resources of the FPGA 1020. In some embodiments, in block 1804, the accelerator sled 1000 may create the RDMA memory region 1668 during boot of the accelerator sled 1000. In some embodiments, in block 1806, the accelerator sled 1000 may create the RDMA memory region 1668 when the FPGA 1020 is composed into a managed node 1570 or other virtual server.

In block 1808, the accelerator sled 1000 sets up an RDMA server instance 1666 for each FPGA 1020. The RDMA server instance 1666 may consume, interface with, or otherwise access the memory region 1668 associated with the corresponding FPGA 1020. After initializing, the RMDA server instance 1666 listens for incoming connections from the compute sleds 800. As described further below, at runtime the RDMA server instance 1666 may process RDMA verbs or other RDMA messages received from the compute sled 800.

In block 1810, the accelerator sled 1000 sets up a virtual switch endpoint for each RMDA server instance 1666. The accelerator sled 1000 may instantiate or otherwise configure an endpoint for the RDMA server instance 1666 with the virtual switch 1664. The virtual switch endpoint may be embodied as a bridge, gateway, virtual device, or other network entity that allows the virtual switch 1664 to forward network traffic to the RDMA server instance 1666. In some embodiments, in block 1812, the accelerator sled 1000 may represent the RDMA memory region 1668 with a virtual network device. The virtual network device may be embodied as a user-level or root-level interface accessible by the virtual switch 1664. For example, the virtual network device may be embodied as a Linux netdev. In some embodiments, the HFI 832 may have multiple I/O paths to memory (e.g., four PCIe lanes or other I/O links). In those embodiments, the I/O path to memory region 1668 mapping may also be added to the flow for management by the master SDN controller.

In block 1814, the accelerator sled 1000 updates a master SDN controller with the configuration of the RMDA server instance 1666. The accelerator sled 1000 may, for example, identify a NIC port, a network protocol port, and identifier, or other information indicative of the RDMA server instance 1666 and/or the virtual switch endpoint associated with the RDMA server instance 1666. The master SDN controller may be embodied as an OVN controller executed by the orchestrator server 1520 or other compute device of the system 1600. The accelerator sled 1000 may update the master SDN controller by updating the OVN southbound database.

In block 1816, the accelerator sled 1000 updates one or more local SDN tables with point-to-point tunnel from the compute sled 800 to the FPGA 1020. The accelerator sled 1000 may receive configuration information regarding the point-to-point tunnel from the master SDN controller (e.g., the orchestrator server 1520). The updated local SDN tables allow the virtual switch 1664 to forward virtual tunnel traffic to the appropriate RDMA server instance 1666. In some embodiments, in block 1818 the accelerator sled 1000 may update the local SDN tables with the HFI 832 port and memory region 1668 netdev associated with the FPGA 1020. The accelerator sled 1000 may also update the SDN tables with the IP address of the remote compute sled 800.

In block 1820, the accelerator sled 1000 switches virtual tunnel traffic to the corresponding RDMA server instance 1666. For example, the HFI 832 may receive encapsulated network traffic over a virtual tunnel 1604. The network traffic may be encapsulated using a virtualized overlay network such as a VxLAN tunnel, Geneve tunnel, or other overlay network. The virtual switch 1664 processes the virtual tunnel traffic using the local SDN tables. The virtual switch 1664 forwards virtual tunnel traffic to the matching RDMA server instance 1666, for example by matching a tunnel key included in the virtual tunnel traffic. The virtual switch 1664 may de-encapsulate the virtual tunnel traffic and deliver de-encapsulated traffic (e.g., L2 packet frames) to the RDMA server instance 1666. The de-encapsulated traffic may include RDMA messages, RDMA verbs, or other RDMA network traffic.

In block 1822, the accelerator sled 1000 transfers data with the FPGA 1020 using one or more RDMA verbs. For example, the accelerator sled 1000 may write data received from the compute sled 800 to one or more virtual addresses within the memory region 1668 associated with the FPGA 1020. The FPGA 1020 may process that data after it is written. As another example, the accelerator sled 1000 may read data from one or more virtual addresses within the memory region 1668 associated with the FGPA 1020. That data (e.g., results data generated by the FPGA 1020) may be transferred back to the compute sled 800 using one or more RDMA messages (e.g., read responses). In some embodiments, in block 1824 the RDMA server instance 1666 may enforce access control to the memory region 1668. For example, each remote compute sled 800 may have mutually exclusive access to a corresponding memory region 1668 associated with the FPGA 1020. After transferring data, the method 1800 loops back to block 1820 to continue switching virtual tunnel traffic.

Figure 19:
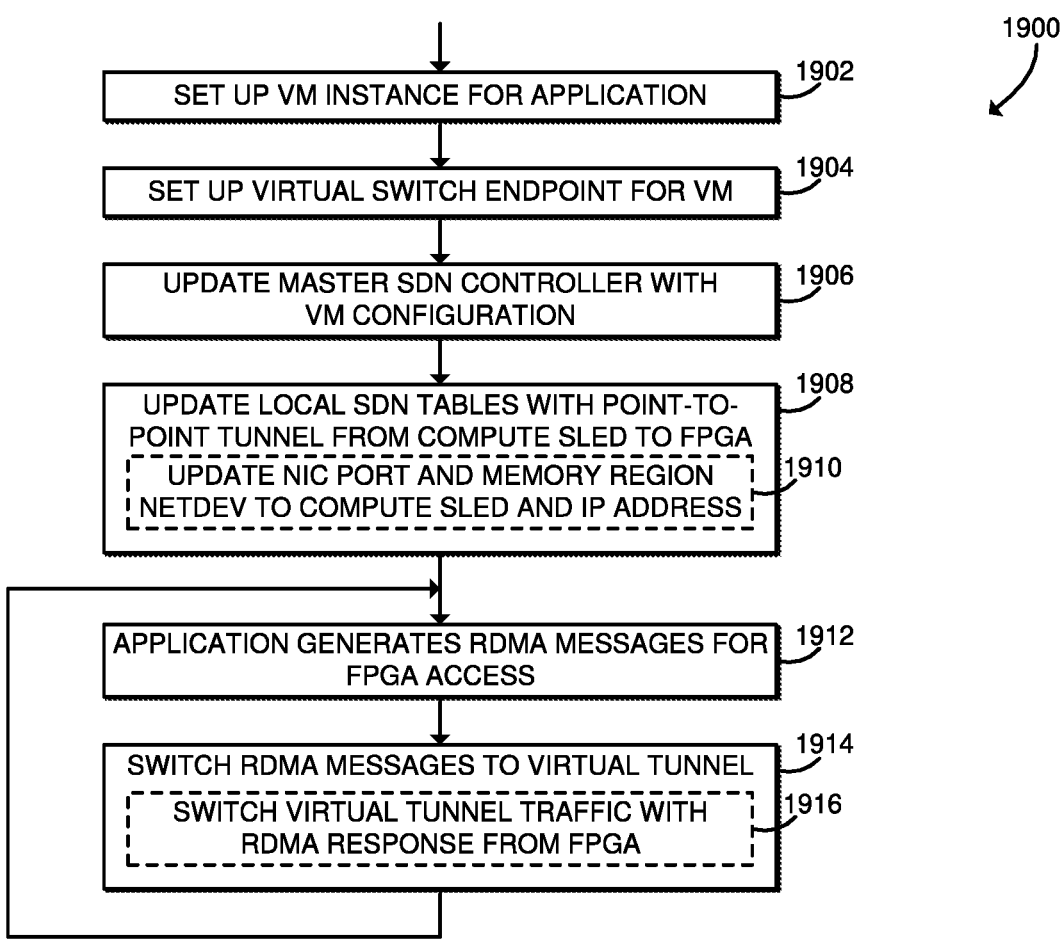
FIG. 19 is a simplified flow diagram of at least one embodiment of a method for managing disaggregated accelerator networks that may be executed by a compute sled of FIG. 16.

Referring now to FIG. 19, in use, the compute sled 800 may execute a method 1900 for managing disaggregated accelerator networks. It should be appreciated that, in some embodiments, the operations of the method 1900 may be performed by one or more components of the environment 1640 of the compute sled 800 as shown in FIG. 16. The method 1900 begins in block 1902, in which the compute sled 800 sets up a VM 1646 instance for an application. The compute sled 800 may instantiate, migrate, or otherwise create the VM 1646. The VM 1646 may be created at the direction of the orchestrator server 1520 or other orchestration layer.

In block 1904, the compute sled 800 sets up a virtual switch endpoint for the VM 1646. The compute sled 800 may instantiate or otherwise configure an endpoint for the VM 1646 with the virtual switch 1644. The virtual switch endpoint may be embodied as a bridge, gateway, virtual device, or other network entity that allows the virtual switch 1644 to forward network traffic to or from the VM 1646.

In block 1906, the compute sled 800 updates a master SDN controller with the configuration of the VM 1646. The compute sled 800 may, for example, identify an IP address, identifier, or other information indicative of the VM 1646. The master SDN controller may be embodied as an OVN controller executed by the orchestrator server 1520 or other compute device of the system 1600. The compute sled 800 may update the master SDN controller by updating the OVN southbound database.

In block 1908, the compute sled 800 updates one or more local SDN tables with point-to-point tunnel from the compute sled 800 to the remote FPGA 1020 of the accelerator sled 1000. The compute sled 800 may receive configuration information regarding the point-to-point tunnel from the master SDN controller (e.g., the orchestrator server 1520). The updated local SDN tables allow the virtual switch 1644 to forward virtual tunnel traffic to or from the appropriate VM 1646. In some embodiments, in block 1910 the compute sled 800 may update the local SDN tables with the HFI 832 port and memory region 1668 netdev associated with the FPGA 1020 of the accelerator sled 1000. The compute sled 800 may also update the SDN tables with the IP address of the compute sled 800 and/or VM 1646. As part of establishing a connection with the FPGA 1020, the compute sled 800 may establish a virtual representor netdev, and that representor netdev may be updated in the OVN DB. This may allow the virtual switch 1644 (e.g., OVS) to process the RDMA transfers at the netdev level.

In block 1912, the application executed by the compute sled 800 (e.g., the VM 1646) generates one or more RDMA messages for accessing the FPGA 1020. The RDMA messages may include or otherwise represent one or more RDMA verbs. For example, the VM 1646 may generate one or more RDMA write messages to write data to the FPGA 1020 for processing. As another example, the VM 1646 may generate one or more RDMA read messages to read data generated by the FPGA 1020 (e.g., output data from processing).

In block 1914, the compute sled switches the RDMA messages to or from the virtual tunnel 1604 to the FPGA 1020. For example, the virtual switch 1644 may receive RDMA messages generated by the FPGA 1020 and process that traffic using the local SDN tables. The virtual switch 1644 forwards the RDMA messages to the virtual tunnel 1604. After being forwarded to the virtual tunnel 1604, the RDMA messages may be encapsulated using a virtualized overlay network such as a VxLAN tunnel, Geneve tunnel, or other overlay network. The encapsulated network traffic is transmitted to the remote accelerator sled 1000 via the underlay network 1602. In some embodiments, in block 1916 the compute sled 800 may switch virtual tunnel traffic including one or more RDMA responses received from the accelerator sled 1000. In those embodiments, the HFI 832 of the compute sled 800 may receive encapsulated network traffic from the accelerator sled 1000 over a virtual tunnel 1604. The virtual switch 1644 forwards the received virtual tunnel traffic to the matching VM 1646, for example by matching a tunnel key included in the virtual tunnel traffic. The virtual switch 1644 may de-encapsulate the virtual tunnel traffic and deliver de-encapsulated traffic (e.g., L2 packet frames) to the VM 1646. The de-encapsulated traffic may include RDMA messages such as RDMA read responses. After switching the virtual network traffic, the method 1900 loops back to block 1912 to continue generating RDMA messages and switching network traffic.

Figure 20:
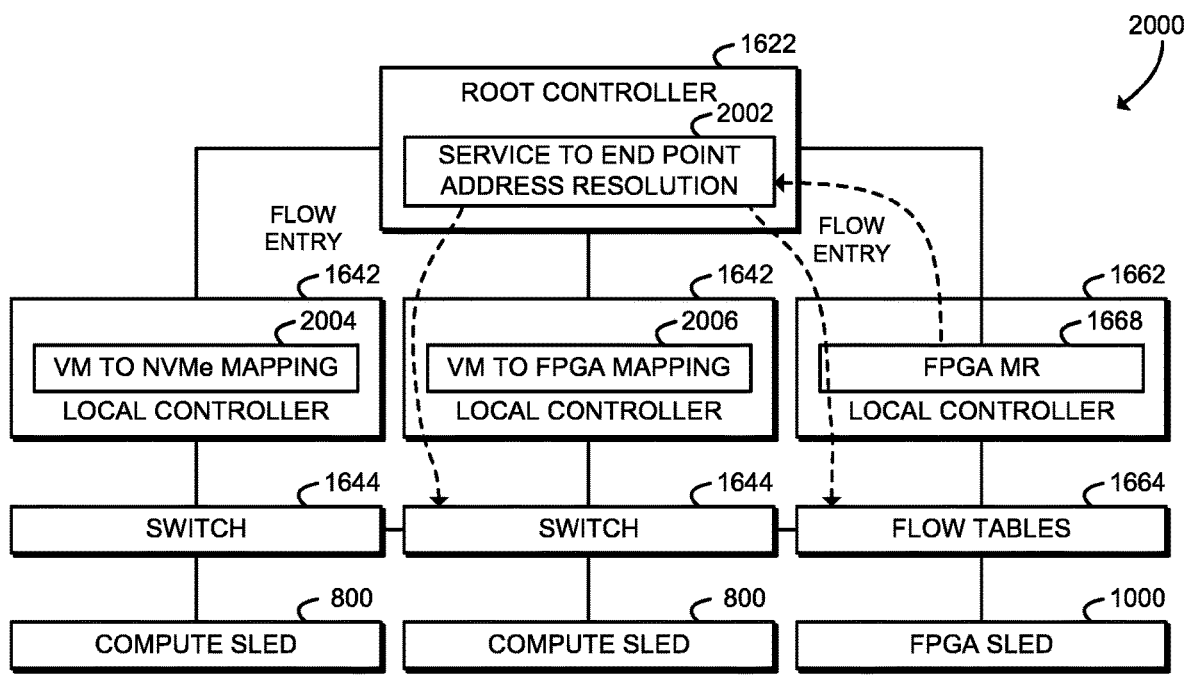
FIG. 20 is a schematic diagram of distributed controller flows to compute and accelerator sleds.

Referring now to FIG. 20, diagram 2000 illustrates distributed controller flows that may be established by the system 1600. As shown, the root SDN controller 1622 includes service to end point address resolution 2002. A local SDN controller of a compute sled 800 (e.g., an SDN agent 1642) may include VM to NVMe mapping 2004 that interacts with the virtual switch 1644. A local SDN controller of another compute sled 800 (e.g., an SDN agent 1642) may include VM to FPGA mapping 2006 that interacts with the virtual switch 1644. A local SDN controller of an accelerator sled 1000 (e.g., an SDN agent 1662) may include the FPGA MR 1668 that interacts with flow tables of the virtual switch 1664. As shown, on flow entry of a virtual tunnel between a compute sled 800 and an FPGA sled 1000, the root SDN controller 1622 may manage end point address resolution for the virtual switch 1644 of the compute sled 800 and the flow tables 1664 of the accelerator sled 1000.

Figure 21:
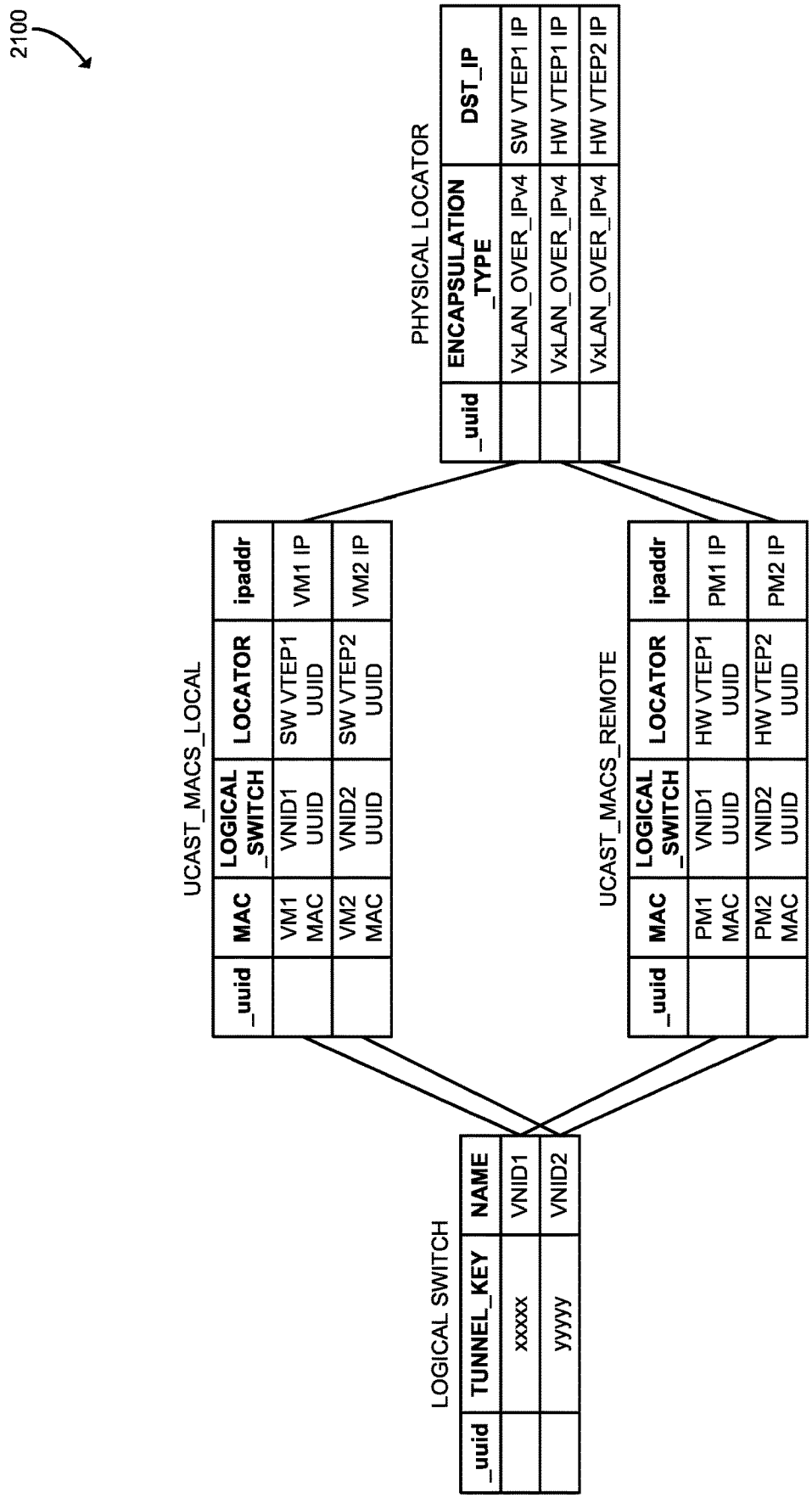
FIG. 21 is a schematic diagram of distributed controller database tables including local and remote tunnel mappings.

Referring now to FIG. 21, diagram 2100 illustrates database tables of a distributed SDN controller including local and remote tunnel mappings. The database tables of diagram 2100 may be included in or otherwise maintained by, for example, the southbound database 1624 of the orchestrator server 1520. Illustratively, the database tables are OVN tables that may be distributed between the root SDN controller 1622 and the SDN agents 1642, 1662. As shown, the database includes a logical switch table (LOGICAL_SWITCH) that includes columns for UUID, tunnel key, and name. The database further includes a unicast local MAC table (UCAST_MACS_LOCAL) that includes columns for UUID, MAC, logical switch, locator, and IP address. The database further includes a unicast remote MAC table (UCAST_MACS_REMOTE) that includes columns for UUID, MAC, logical switch, locator, and IP address. The database further includes a physical locator table (PHYSICAL LOCATOR) that includes fields for UUID, encapsulation type, and destination IP. As shown, the tables of diagram 2100 may be used to map local and remote tunnel endpoints for VxLAN tunnels.

The system 1600 may include two additional database tables that map NIC port and memory region netdevs to compute sleds and their associated IP addresses. Table 1, below, shows an illustrative database table that includes RDMA server details for an accelerator sled 1000. The SDN agent 1662 of the accelerator sled 1000 may update the southbound database 1624 with RDMA server details as shown in Table 1.

TABLE 1

RDMA server details.

| UUID | FPGA NAME (optional) | SLED ADDRESS | SLED PORT |
|---|---|---|---|
| 1ecdbd36-c560-4b52-85a5-9fe6dbfd340c | CRYPTO-FPGA | 200.0.0.1 | 4791 |
| 7af6f518-246e-4be6-bd36-b77f2a9621b1 | DPI-FPGA | 200.0.0.1 | 4789 |
| 30a241e6-9f11-48b1-8073-c65977ace560 | COMPR-FPGA | 200.0.0.1 | 4781 |
| ... | ... | ... | ... |

Table 2, below, shows an illustrative database table that includes compute sled 800 tunnel details. The SDN controller 1622 may update the southbound database 1624 with tunnel details as shown in Table 2. The SDN agent 1662 of the accelerator sled 1000 may update flow tables or other data of the virtual switch 1664 to perform routing as described in Table 2. For example, to perform cryptographic operations on application traffic from a compute sled 800 (with IP address 200.0.0.192), the virtual switch 1664 instance in the accelerator sled 1000 may forward the traffic to the memory region 'fpga-fd198021' based on a rule programmed by the SDN agent 1662 (e.g., OVN).

TABLE 2

Tunnel details.

| CONNEC-TION-ID (TNL ID) | FPGA ID | COMPUTE IP | COMPUTE PORT | MR NETDEV |
|---|---|---|---|---|
| fd198021-d1f9-44fd-8b69-6bfccb3e3e63 | 1ecdbd36-c560-4b52-85a5-9fe6dbfd340c | 200.0.0.192 | 7892 | MR-fd198021 |
| 8ae9617f-2e6a-4a0e-be5d-4412c6e47a26 | 30a241e6-9f11-48b1-8073-c65977ace560 | 200.0.0.192 | 9823 | MR-8ae9617f |
| ... | ... | ... | ... | |

EXAMPLES

Illustrative examples of the technologies disclosed herein are provided below. An embodiment of the technologies may include any one or more, and any combination of, the examples described below.

Example 1 includes a compute device for disaggregated accelerator network management, the compute device comprising a memory region manager to configure a first virtual switch endpoint associated with a first remote direct memory access (RDMA) server instance, wherein the first RDMA server instance is associated with a first accelerator device of the compute device; a software defined network agent to (i) update a master software defined network controller in response to configuration of the first virtual switch endpoint, and (ii) receive a virtual tunnel configuration associated with a first virtual tunnel from the master software defined network controller in response to an update of the master software defined network controller, wherein the first virtual tunnel is associated with the first virtual switch endpoint and a first remote compute sled; and a virtual switch to switch virtual tunnel traffic from the remote compute sled to the first RDMA server instance via the first virtual switch endpoint with the virtual tunnel configuration.

Example 2 includes the subject matter of Example 1, and wherein the first RDMA server instance is to transfer data to the first accelerator device with one or more RDMA verbs in response to switching of the virtual tunnel traffic.

Example 3 includes the subject matter of any of Examples 1 and 2, and wherein the first virtual switch endpoint comprises a virtual network device established by an operating system of the compute device.

Example 4 includes the subject matter of any of Examples 1-3, and wherein to switch the virtual tunnel traffic comprises to receive the virtual tunnel traffic from the first remote compute sled via a network interface controller of the compute device; determine whether the virtual tunnel traffic matches a first tunnel key associated with the first virtual tunnel; de-encapsulate the virtual tunnel traffic to generate one or more RDMA verbs in response to a determination that the virtual tunnel traffic matches the first tunnel key; and forward the one or more RDMA verbs to the first RDMA server instance in response to de-encapsulation of the virtual tunnel traffic.

Example 5 includes the subject matter of any of Examples 1-4, and wherein to switch the virtual tunnel traffic further comprises to receive the virtual tunnel traffic from a second remote compute sled via the network interface controller; determine whether the virtual tunnel traffic matches a second tunnel key associated with a second virtual tunnel, wherein the second virtual tunnel is associated with a second virtual switch endpoint and the second remote compute sled, and wherein the second virtual switch endpoint is associated with a second RDMA server instance that is associated with a second accelerator device of the compute device; de-encapsulate the virtual tunnel traffic to generate the one or more RDMA verbs in response to a determination that the virtual tunnel traffic matches the second tunnel key; and forward the one or more RDMA verbs to the second RDMA server instance in response to de-encapsulation of the virtual tunnel traffic.

Example 6 includes the subject matter of any of Examples 1-5, and wherein to update the master software defined network controller comprises to update a southbound database of the master software defined network controller with data indicative of the first virtual switch endpoint.

Example 7 includes the subject matter of any of Examples 1-6, and wherein the software defined network agent is further to update a local software defined network table with the first virtual tunnel based on the virtual tunnel configuration received from the master software defined network controller.

Example 8 includes the subject matter of any of Examples 1-7, and wherein the virtual tunnel configuration is indicative of a network interface controller port and a first RDMA memory region that is associated with the first accelerator device, and wherein the virtual tunnel configuration is indicative of an IP address of the first remote compute sled.

Example 9 includes the subject matter of any of Examples 1-8, and wherein the memory region manager is further to create a first RDMA memory region associated with the first accelerator device; and associate the first RDMA server instance with the first RDMA memory region.

Example 10 includes the subject matter of any of Examples 1-9, and wherein the first RDMA server instance is further to enforce access control to the first RDMA memory region based on the first virtual tunnel in response to switching of the virtual tunnel traffic.

Example 11 includes the subject matter of any of Examples 1-10, and wherein to create the first RDMA memory region associated with the first accelerator device comprises to create the first RDMA memory region associated with the first accelerator device in response to booting of the compute device.

Example 12 includes the subject matter of any of Examples 1-11, and wherein to create the first RDMA memory region associated with the first accelerator device comprises to create the first RDMA memory region associated with the first accelerator device in response to composition of a virtual server that includes the remote compute device and the accelerator device.

Example 13 includes the subject matter of any of Examples 1-12, and wherein the first accelerator device comprises a field-programmable gate array (FPGA) device.

Example 14 includes the subject matter of any of Examples 1-13, and wherein the compute device comprises an accelerator sled.

Example 15 includes a method for a disaggregated accelerator network management, the method comprising configuring, by a compute device, a first virtual switch endpoint associated with a first remote direct memory access (RDMA) server instance, wherein the first RDMA server instance is associated with a first accelerator device of the compute device; updating, by the compute device, a master software defined network controller in response to configuring the first virtual switch endpoint; receiving, by the compute device, a virtual tunnel configuration associated with a first virtual tunnel from the master software defined network controller in response to updating the master software defined network controller, wherein the first virtual tunnel is associated with the first virtual switch endpoint and a first remote compute sled; and switching, by the compute device, virtual tunnel traffic from the remote compute sled to the first RDMA server instance via the first virtual switch endpoint using the virtual tunnel configuration.

Example 16 includes the subject matter of Example 15, and further including transferring, by the compute device, data to the first accelerator device using one or more RDMA verbs in response to switching the virtual tunnel traffic.

Example 17 includes the subject matter of any of Examples 15 and 16, and wherein the first virtual switch endpoint comprises a virtual network device established by an operating system of the compute device.

Example 18 includes the subject matter of any of Examples 15-17, and wherein switching the virtual tunnel traffic comprises receiving the virtual tunnel traffic from the first remote compute sled via a network interface controller of the compute device; determining whether the virtual tunnel traffic matches a first tunnel key associated with the first virtual tunnel; de-encapsulating the virtual tunnel traffic to generate one or more RDMA verbs in response to determining that the virtual tunnel traffic matches the first tunnel key; and forwarding the one or more RDMA verbs to the first RDMA server instance in response to de-encapsulating the virtual tunnel traffic.

Example 19 includes the subject matter of any of Examples 15-18, and wherein switching the virtual tunnel traffic further comprises receiving the virtual tunnel traffic from a second remote compute sled via the network interface controller; determining whether the virtual tunnel traffic matches a second tunnel key associated with a second virtual tunnel, wherein the second virtual tunnel is associated with a second virtual switch endpoint and the second remote compute sled, and wherein the second virtual switch endpoint is associated with a second RDMA server instance that is associated with a second accelerator device of the compute device; de-encapsulating the virtual tunnel traffic to generate the one or more RDMA verbs in response to determining that the virtual tunnel traffic matches the second tunnel key; and forwarding the one or more RDMA verbs to the second RDMA server instance in response to de-encapsulating the virtual tunnel traffic.

Example 20 includes the subject matter of any of Examples 15-19, and wherein updating the master software defined network controller comprises updating a southbound database of the master software defined network controller with data indicative of the first virtual switch endpoint.

Example 21 includes the subject matter of any of Examples 15-20, and further including updating, by the compute device, a local software defined network table with the first virtual tunnel based on the virtual tunnel configuration received from the master software defined network controller.

Example 22 includes the subject matter of any of Examples 15-21, and wherein the virtual tunnel configuration is indicative of a network interface controller port and a first RDMA memory region that is associated with the first accelerator device, and wherein the virtual tunnel configuration is indicative of an IP address of the first remote compute sled.

Example 23 includes the subject matter of any of Examples 15-22, and further including creating, by the compute device, a first RDMA memory region associated with the first accelerator device; and associating, by the compute device, the first RDMA server instance with the first RDMA memory region.

Example 24 includes the subject matter of any of Examples 15-23, and further including enforcing, by the compute device, access control to the first RDMA memory region based on the first virtual tunnel in response to switching the virtual tunnel traffic.

Example 25 includes the subject matter of any of Examples 15-24, and further including booting the compute device; wherein creating the first RDMA memory region associated with the first accelerator device comprises creating the first RDMA memory region associated with the first accelerator device in response to booting the compute device.

Example 26 includes the subject matter of any of Examples 15-25, and further including composing a virtual server that includes the remote compute device and the accelerator device; wherein creating the first RDMA memory region associated with the first accelerator device comprises creating the first RDMA memory region associated with the first accelerator device in response to composing the virtual server.

Example 27 includes the subject matter of any of Examples 15-26, and wherein the first accelerator device comprises a field-programmable gate array (FPGA) device.

Example 28 includes the subject matter of any of Examples 15-27, and wherein the compute device comprises an accelerator sled.

Example 29 includes a computing device comprising a processor; and a memory having stored therein a plurality of instructions that when executed by the processor cause the computing device to perform the method of any of Examples 15-28.

Example 30 includes one or more non-transitory, computer readable storage media comprising a plurality of instructions stored thereon that in response to being executed result in a computing device performing the method of any of Examples 15-28.

Example 31 includes a computing device comprising means for performing the method of any of Examples 15-28.

The invention claimed is:

1. A compute device comprising:
    circuitry to:
    configure a first virtual switch endpoint associated with a first remote direct memory access (RDMA) server instance, wherein the first RDMA server instance is associated with a first accelerator device of the compute device;
    update a master software defined network controller in response to configuration of the first virtual switch endpoint
    receive a virtual tunnel configuration associated with a first virtual tunnel from the master software defined network controller in response to the update of the master software defined network controller, wherein the first virtual tunnel is associated with the first virtual switch endpoint and a first remote compute device;
    create a first RDMA memory region associated with the first accelerator device in response to composition of a virtual server that includes the first remote compute device and the first accelerator device;
    associate the first RDMA server instance with the first RDMA memory region; and
    switch virtual tunnel traffic from the first remote compute device to the first RDMA server instance via the first virtual switch endpoint with the virtual tunnel configuration.

2. The compute device of claim 1, wherein the first RDMA server instance is to transfer data to the first accelerator device with one or more RDMA verbs in response to switching of the virtual tunnel traffic.

3. The compute device of claim 1, wherein the first virtual switch endpoint comprises a virtual network device established by an operating system of the compute device.

4. The compute device of claim 1, wherein to switch the virtual tunnel traffic comprises to:
    receive the virtual tunnel traffic from the first remote compute device via a network interface controller of the compute device;
    determine whether the virtual tunnel traffic matches a first tunnel key associated with the first virtual tunnel;
    de-encapsulate the virtual tunnel traffic to generate one or more RDMA verbs in response to a determination that the virtual tunnel traffic matches the first tunnel key; and
    forward the one or more RDMA verbs to the first RDMA server instance in response to de-encapsulation of the virtual tunnel traffic.

5. The compute device of claim 4, wherein to switch the virtual tunnel traffic further comprises to:
    receive the virtual tunnel traffic from a second remote compute sled via the network interface controller;
    determine whether the virtual tunnel traffic matches a second tunnel key associated with a second virtual tunnel, wherein the second virtual tunnel is associated with a second virtual switch endpoint and the second remote compute sled, and wherein the second virtual switch endpoint is associated with a second RDMA server instance that is associated with a second accelerator device of the compute device;
    de-encapsulate the virtual tunnel traffic to generate the one or more RDMA verbs in response to a determination that the virtual tunnel traffic matches the second tunnel key; and
    forward the one or more RDMA verbs to the second RDMA server instance in response to de-encapsulation of the virtual tunnel traffic.

6. The compute device of claim 1, wherein to update the master software defined network controller comprises to update a southbound database of the master software defined network controller with data indicative of the first virtual switch endpoint.

7. The compute device of claim 1, wherein the circuitry is further to update a local software defined network table with the first virtual tunnel based on the virtual tunnel configuration received from the master software defined network controller.

8. The compute device of claim 7, wherein the virtual tunnel configuration is indicative of a network interface controller port and a first RDMA memory region that is associated with the first accelerator device, and wherein the virtual tunnel configuration is indicative of an IP address of the first remote compute device.

9. The compute device of claim 1, wherein the first RDMA server instance is further to enforce access control to the first RDMA memory region based on the first virtual tunnel in response to switching of the virtual tunnel traffic.

10. The compute device of claim 1, wherein to create the first RDMA memory region associated with the first accelerator device comprises to create the first RDMA memory region associated with the first accelerator device in response to booting of the compute device.

11. The compute device of claim 1, wherein the first accelerator device comprises a field-programmable gate array (FPGA) device.

12. The compute device of claim 1, wherein the compute device comprises an accelerator sled.

13. A method comprising:
    configuring, by a compute device, a first virtual switch endpoint associated with a first remote direct memory access (RDMA) server instance, wherein the first RDMA server instance is associated with a first accelerator device of the compute device;
    updating, by the compute device, a master software defined network controller in response to configuring the first virtual switch endpoint;
    receiving, by the compute device, a virtual tunnel configuration associated with a first virtual tunnel from the master software defined network controller in response to the updating of the master software defined network controller, wherein the first virtual tunnel is associated with the first virtual switch endpoint and a first remote compute sled;
    creating, by the compute device, a first RDMA memory region associated with the first accelerator device in response to composition of a virtual server that includes the first remote compute sled and the first accelerator device;
associating, by the compute device, the first RDMA server instance with the first RDMA memory region; and
switching, by the compute device, virtual tunnel traffic from the first remote compute sled to the first RDMA server instance via the first virtual switch endpoint using the virtual tunnel configuration.

14. The method of claim 13, further comprising transferring, by the compute device, data to the first accelerator device using one or more RDMA verbs in response to switching the virtual tunnel traffic.

15. The method of claim 13, wherein the first virtual switch endpoint comprises a virtual network device established by an operating system of the compute device.

16. The method of claim 13, wherein switching the virtual tunnel traffic comprises:
receiving the virtual tunnel traffic from the first remote compute sled via a network interface controller of the compute device;
determining whether the virtual tunnel traffic matches a first tunnel key associated with the first virtual tunnel;
de-encapsulating the virtual tunnel traffic to generate one or more RDMA verbs in response to determining that the virtual tunnel traffic matches the first tunnel key; and
forwarding the one or more RDMA verbs to the first RDMA server instance in response to de-encapsulating the virtual tunnel traffic.

17. One or more non-transitory computer-readable storage media comprising a plurality of instructions stored thereon that, in response to being executed, cause a compute device to:
configure a first virtual switch endpoint associated with a first remote direct memory access (RDMA) server instance, wherein the first RDMA server instance is associated with a first accelerator device of the compute device;
update a master software defined network controller in response to configuring the first virtual switch endpoint;
receive a virtual tunnel configuration associated with a first virtual tunnel from the master software defined network controller in response to the updating of the master software defined network controller, wherein the first virtual tunnel is associated with the first virtual switch endpoint and a first remote compute sled;
create a first RDMA memory region associated with the first accelerator device in response to composition of a virtual server that includes the first remote compute sled and the first accelerator device;
associate the first RDMA server instance with the first RDMA memory region; and
switch virtual tunnel traffic from the first remote compute sled to the first RDMA server instance via the first virtual switch endpoint using the virtual tunnel configuration.

18. The one or more non-transitory computer-readable storage media of claim 17, further comprising a plurality of instructions stored thereon that, in response to being executed, cause the compute device to transfer data to the first accelerator device using one or more RDMA verbs in response to switching the virtual tunnel traffic.

19. The one or more non-transitory computer-readable storage media of claim 17, wherein the first virtual switch endpoint comprises a virtual network device established by an operating system of the compute device.

20. The one or more non-transitory computer-readable storage media of claim 17, wherein to switch the virtual tunnel traffic comprises to:
receive the virtual tunnel traffic from the first remote compute sled via a network interface controller of the compute device;
determine whether the virtual tunnel traffic matches a first tunnel key associated with the first virtual tunnel;
de-encapsulate the virtual tunnel traffic to generate one or more RDMA verbs in response to determining that the virtual tunnel traffic matches the first tunnel key; and
forward the one or more RDMA verbs to the first RDMA server instance in response to de-encapsulating the virtual tunnel traffic.

21. The one or more non-transitory computer-readable storage media of claim 17, further comprising a plurality of instructions stored thereon that, in response to being executed, cause the compute device to:
create a first RDMA memory region associated with the first accelerator device; and
associate the first RDMA server instance with the first RDMA memory region.

22. The one or more non-transitory computer-readable storage media of claim 21, further comprising a plurality of instructions stored thereon that, in response to being executed, cause the compute device to boot the compute device
wherein to create the first RDMA memory region associated with the first accelerator device comprises to create the first RDMA memory region associated with the first accelerator device in response to booting the compute device.

23. A compute device comprising:
circuitry to:
receive a virtual tunnel configuration associated with a first virtual tunnel from a master software defined network controller, wherein the first virtual tunnel is associated with the compute device and a first virtual switch endpoint of a remote accelerator sled;
create a first RDMA memory region associated with the remote accelerator sled in response to composition of a virtual server that includes the compute device and the remote accelerator sled;
associate a first RDMA server instance with the first RDMA memory region;
and
switch virtual tunnel traffic from the compute device to the first virtual switch endpoint with the virtual tunnel configuration.

24. The compute device of claim 23, wherein the first virtual switch endpoint is associated with a first remote direct memory access (RDMA) server instance of the remote accelerator sled, wherein the first RDMA server instance is associated with a first accelerator device of the remote accelerator sled.

25. The compute device of claim 24, further comprising a first virtual machine to generate the virtual tunnel traffic, wherein the virtual tunnel traffic comprises one or more RDMA verbs.

* * * * *